US012213300B2

(12) United States Patent
Chen

(10) Patent No.: US 12,213,300 B2
(45) Date of Patent: Jan. 28, 2025

(54) MEMORY AND METHOD FOR MANUFACTURING MEMORY

(71) Applicant: CHANGXIN MEMORY TECHNOLOGIES, INC., Hefei (CN)

(72) Inventor: Tao Chen, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 813 days.

(21) Appl. No.: 17/447,198

(22) Filed: Sep. 8, 2021

(65) Prior Publication Data
US 2022/0285352 A1 Sep. 8, 2022

Related U.S. Application Data

(63) Continuation of application No. PCT/CN2021/103739, filed on Jun. 30, 2021.

(30) Foreign Application Priority Data

Mar. 4, 2021 (CN) .......................... 202110241856.8

(51) Int. Cl.
H10B 12/00 (2023.01)

(52) U.S. Cl.
CPC ........... *H10B 12/30* (2023.02); *H10B 12/482* (2023.02); *H10B 12/485* (2023.02); *H10B 12/488* (2023.02)

(58) Field of Classification Search
CPC .. H10B 12/0335; H10B 12/315; H10B 12/30; H10B 12/488; H10B 12/485; H10B 12/482
See application file for complete search history.

(56) References Cited

U.S. PATENT DOCUMENTS

| 8,426,903 | B2 | 4/2013 | Kujirai |
| 9,136,227 | B2 | 9/2015 | Takaishi |
| 9,343,507 | B2 | 5/2016 | Takaki |
| 10,115,895 | B1 | 10/2018 | Takaki et al. |
| 2009/0236656 | A1* | 9/2009 | Sung .................... H10B 12/488 257/329 |
| 2011/0156120 | A1 | 6/2011 | Kujirai |

(Continued)

FOREIGN PATENT DOCUMENTS

| CN | 1143393 C | 3/2004 |
| CN | 210640250 U | 5/2020 |

(Continued)

*Primary Examiner* — Antonio B Crite
(74) *Attorney, Agent, or Firm* — Syncoda LLC; Feng Ma

(57) ABSTRACT

A memory includes a substrate. An isolation layer is disposed on the substrate. The plurality of active regions arranged in an array are disposed in the isolation layer. A plurality of word lines are formed in the plurality of active regions and the isolation layer. Each word line includes gates disposed in the active regions and word line structures disposed in the isolation layer. The each word line is constituted by successive connection of the plurality of gates and the plurality of word line structures arranged at intervals. The plurality of gates included in the each word line are disposed in two correspondingly adjacent columns of active regions, and any two adjacent gates in the each word line are disposed in two correspondingly adjacent rows of active regions.

18 Claims, 30 Drawing Sheets

(56) References Cited

U.S. PATENT DOCUMENTS

2011/0215391 A1    9/2011   Takaishi
2015/0263074 A1    9/2015   Takaki
2019/0393222 A1   12/2019   Sharma et al.

FOREIGN PATENT DOCUMENTS

| CN | 111900164 A | 11/2020 |
| CN | 113053897 A | 6/2021 |
| JP | H0774266 A | 3/1995 |

\* cited by examiner

MEMORY AND METHOD FOR MANUFACTURING MEMORY

This application is a continuation of International Application No. PCT/CN2021/103739 filed on Jun. 30, 2021, which claims priority to Chinese Patent Application No. 202110241856.8 filed on Mar. 4, 2021. The disclosures of these applications are hereby incorporated by reference in their entirety.

BACKGROUND

A Dynamic Random-Access Memory (DRAM) is a semiconductor memory that can rapidly and randomly write and read data, and is widely applied to a data storage device or apparatus.

SUMMARY

The present disclosure relates generally to the technical field of semiconductors, and more specifically to a memory and a method for manufacturing memory.

In view of the problem above, embodiments of the present disclosure provide a memory and a method for manufacturing memory for improving the integration level of the memory.

To implement the purpose above, the embodiments of the present disclosure provide the following technical solution.

A first aspect of the embodiments of the present disclosure provides a memory, which includes a substrate, where an isolation layer is disposed on the substrate. a plurality of active regions arranged in an array according to rows and columns are disposed in the isolation layer, a plurality of word lines are formed in the plurality of active regions and the isolation layer, the plurality of word lines are arranged along a row direction of the plurality of active regions, each word line is in an S shape, the each word line includes a plurality of gates disposed in the plurality of active regions and word line structures disposed in the isolation layer, the each word line is constituted by successive connection the plurality of gates and the word line structures arranged at intervals, and the plurality of gates included in the each word line are disposed in two correspondingly adjacent columns of active regions, and any two adjacent gates in the each word line are disposed in two correspondingly adjacent rows of active regions.

A second aspect of the embodiments of the present disclosure provides a method manufacturing memory. The method includes the following steps. A substrate is provided. An isolation layer is formed on the substrate. The plurality of active regions are arranged in an array according to rows and column in the isolation layer. A plurality of word lines are formed in the isolation layer and the plurality of active regions. The plurality of word lines are arranged along a row direction of the plurality of active regions. Each word line is in an S shape. The each word line includes a plurality of gates disposed in the plurality of active regions and word line structures disposed in the isolation layer. The each word line is constituted by successive connection of the plurality of gates and the word line structures arranged at intervals. The plurality of gates included in the each word line are located in two correspondingly adjacent columns of active regions. Any two adjacent gates in the each word line are located in two correspondingly adjacent rows of active regions In addition to the technical problems solved by the embodiments of the present disclosure, technical features constituting the technical solutions, and advantageous effects brought by the technical features of the technical solutions described above, other technical problems that can be solved by the memory and the method for manufacturing memory provided by the embodiments of the present disclosure, other technical features included in the technical solutions, and advantageous effects brought by the technical features would be further explained in detail in the embodiments.

BRIEF DESCRIPTION OF THE DRAWINGS

To describe the technical solutions in the embodiments of the present disclosure or the prior art more clearly, the accompanying drawings required for describing the embodiments or the prior art are briefly described hereinafter. Apparently, the accompanying drawings in the following description show some embodiments of the present disclosure, and a person of ordinary skill in the art may obtain other accompanying drawings from these accompanying drawings without creative efforts.

NUMERAL REFERENCES

Figure 1:
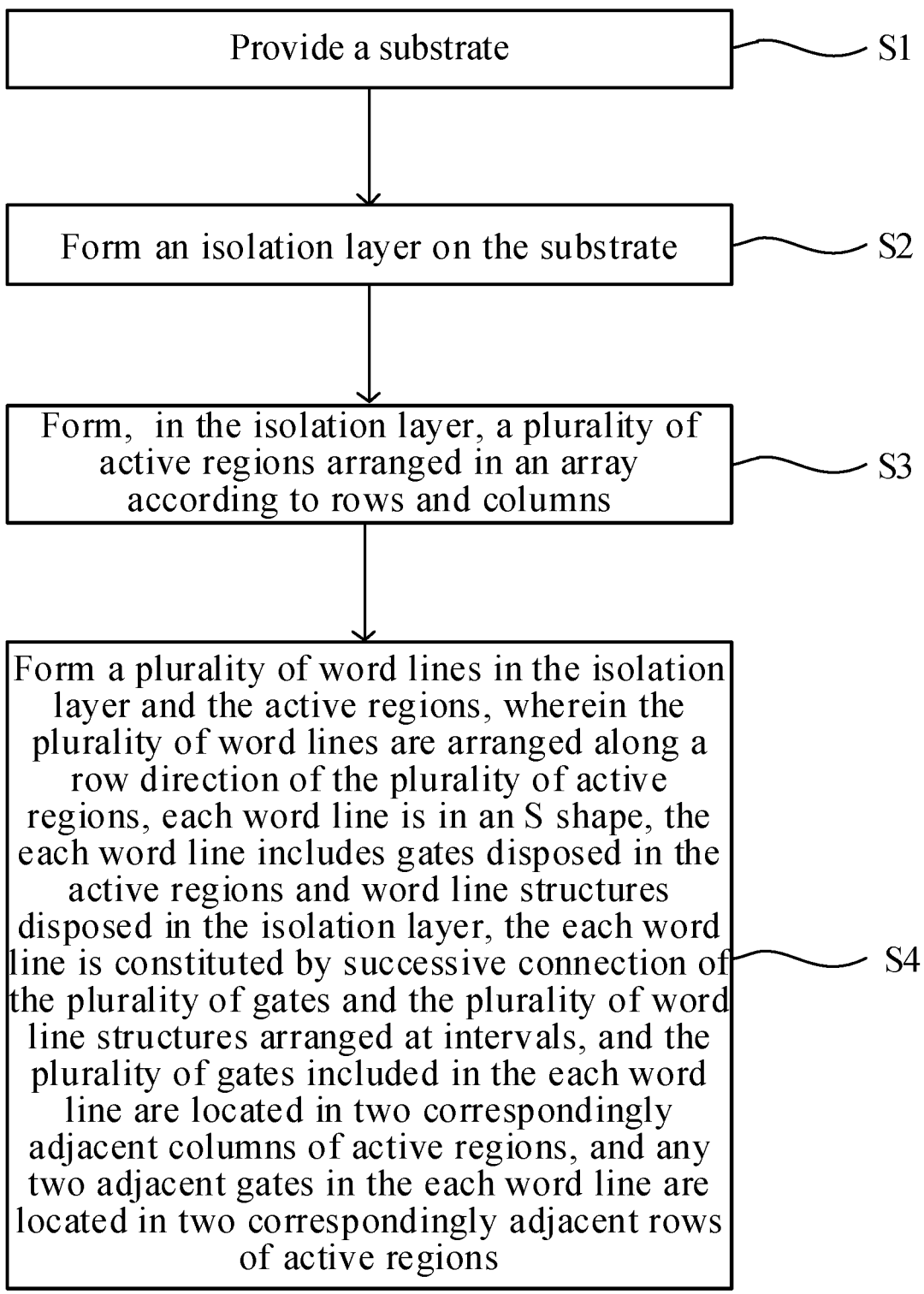
FIG. 1 is a flowchart of a method for manufacturing memory according to the embodiments of the present disclosure.

| | |
|---|---|
| 100: substrate; | 101: bit line; |
| 102: bit line slot; | 103: first insulation material; |
| 104: conductive material; | 105: second insulation material; |
| 106: third insulation material; | 107: bit line contact plunger; |
| 200: isolation layer; | 201: active region; |
| 202: concave hole; | 203: second polycrystalline silicon; |
| 204: protective layer; | 205: node contact slot; |
| 206: word line slot; | 207: word line; |
| 208: gate; | 209: word line structure; |
| 210: first word line slot; | 211: second word line slot; |
| 212: first word line structure; | 213: second word line structure; |
| 214: metal layer; | 215: dielectric layer; |
| 216: first dielectric layer; | 217: second dielectric layer; |
| 218: third dielectric layer; | 219: node contact plunger; |

DETAILED DESCRIPTION

To manufacture a DRAM, typically a shallow groove isolation structure is first formed to define active regions generally, then the active regions are etched to form embedded word lines, bit line contact plungers are formed among the embedded word lines, and then each bit line contact plunger is connected by means of the bit lines. Moreover, the structure of the relatively mainstream DRAM in the prior art is a 3HPAA-multiply-2HPWL. 3HPAA-multiply-2HPWL determines a cell bit area. The 3HPAA-multiply-2HPWL refers to three times of a half pitch (HP) of the active region multiplied by twice of the HP of the word line (WL). However, the integration level of the DRAM in this structure is relatively low.

The resulting DRAM generally includes a substrate, an isolation structure disposed in the substrate, and a plurality of active regions disposed in the isolation structure. A gate is disposed in each active region. A word line structure used for connecting a plurality of gates located in the same column is disposed in the isolation structure. The gate and the word line structure together constitute the word line. A bit line contact plunger in contact with the active region is disposed in the isolation structure. A plurality of bit line contact plungers in contact with the active regions in the same row are connected through the bit line. A capacitor is disposed at two ends of each active region. The capacitor is used for storing charges.

However, for the DRAM in this structure, on the substrate of a unit size, the relatively small number of active regions is disposed correspondingly and the relatively small number of capacitors is disposed correspondingly, and the integration level of the memory is low. With this regard, the embodiments of the present disclosure provide a memory and a method for manufacturing memory. For the memory and the memory manufactured using the method for manufacturing memory, an isolation layer is disposed in the substrate, a plurality of active regions arranged according to rows and columns are disposed in the isolation layer, a plurality of word lines are disposed in the isolation layer and the active regions, each word line is in an S shape; each word line is constituted by successive connection of the plurality of gates and the plurality of word line structures disposed at intervals; the plurality of gates comprised in the each word line are successively and alternatively disposed in the two correspondingly adjacent columns of active regions, and any two adjacent gates in the each word line are disposed in two correspondingly adjacent rows of active regions. In this way, the number of active regions correspondingly disposed in the substrate of a unit size is greater, the number of subsequently disposed capacitors corresponding to the active regions one to one is greater, and the integration level of the memory is higher.

To make the objectives, features, and advantages of the present disclosure clearer and easy to understand, the following clearly and completely describes the technical solutions in the embodiments of the present disclosure with reference to the accompanying drawings in the embodiments of the present disclosure. Apparently, the described embodiments are merely some rather than all of the embodiments of the present disclosure. All other embodiments obtained by a person of ordinary skill in the art based on the embodiments of the present disclosure without creative efforts shall fall within the protection scope of the present disclosure The terms used herein are for the purpose of describing particular embodiments only and are not intended to be limiting of the present disclosure. As used herein, the singular forms "a/an", "one", and "the" are also intended to include the plural forms as well, unless the context clearly dictates otherwise. It should also be understood that when the terms "composed of" and/or "including" are used in this specification, the presence of the features, integers, steps, operations, elements, and/or components is determined, but the presence or addition of one or more other features, integers, steps, operations, elements, components, and/or groups is also possible. As used herein, the term "and/or" includes any and all combinations of the associated listed items.

As shown in FIG. 1, a method for manufacturing memory provided by the embodiments includes the following steps.

At step S1, a substrate is provided. The material of the substrate may be silicon or germanium, and other semiconductor substrate materials well-known to a person skilled in the art.

At step S2, an isolation layer is formed on the substrate. The material of the isolation layer may be, for example, silicon dioxide.

In some embodiments, before forming the isolation layer on the substrate, the method for manufacturing memory further includes the following steps.

At step J1, a plurality of bit lines are formed on the substrate. Each bit line extends along the row direction of the active regions which is mentioned hereinafter. The plurality of bit lines are arranged along the column direction of the plurality of active regions which is mentioned hereinafter.

Figure 2:
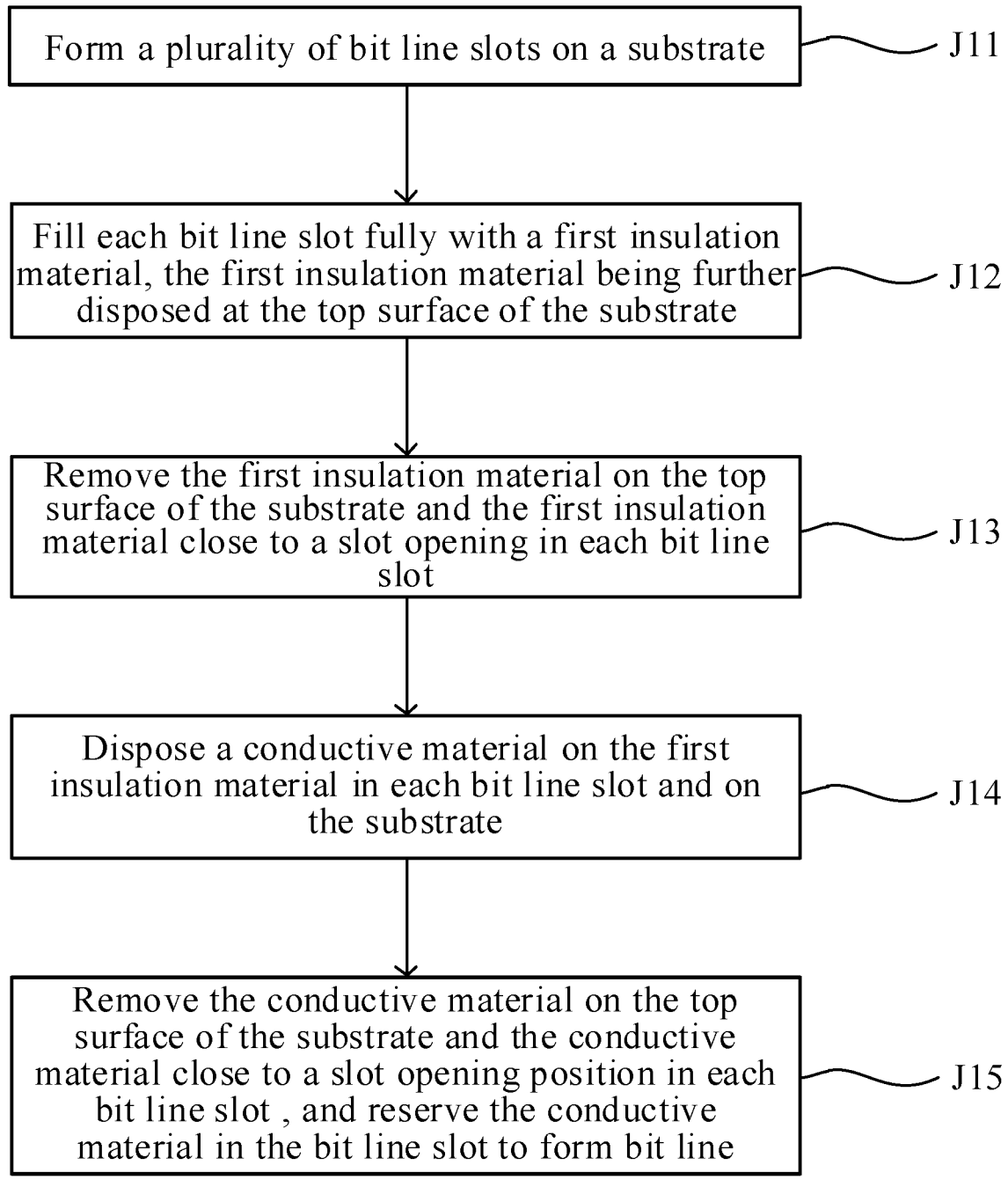
FIG. 2 is a flowchart of manufacturing of bit lines according to the embodiment s of the present disclosure.

With reference to FIG. 2, the step of forming the plurality of bit lines on the substrate includes the following steps.

Figure 3A:
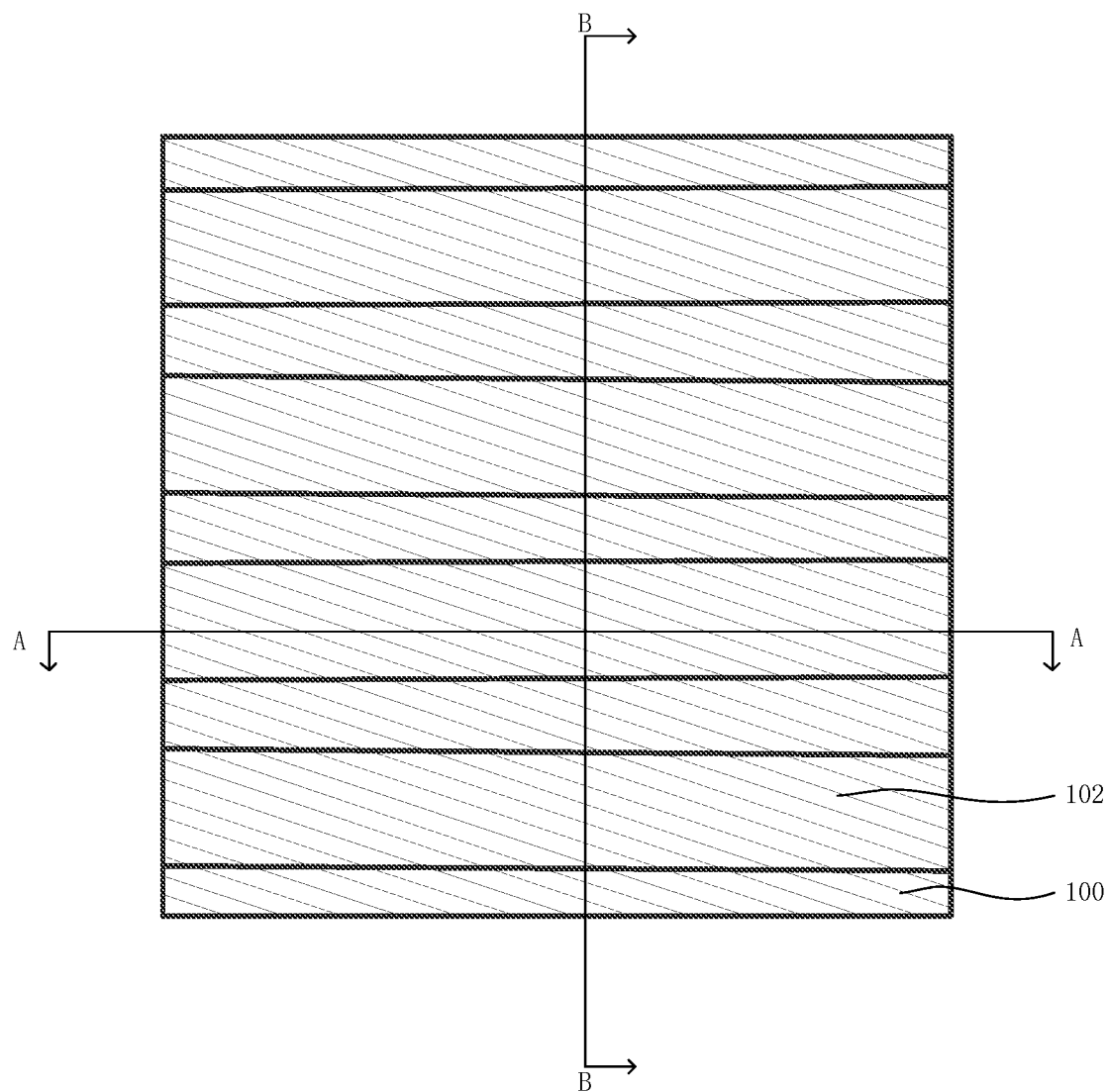
FIG. 3A is a structural schematic diagram of bit line slots disposed on a substrate according to the embodiment s of the present disclosure.
Figure 3B:
FIG. 3B is a cross-section diagram of position AA in FIG. 3A.
Figure 3C:
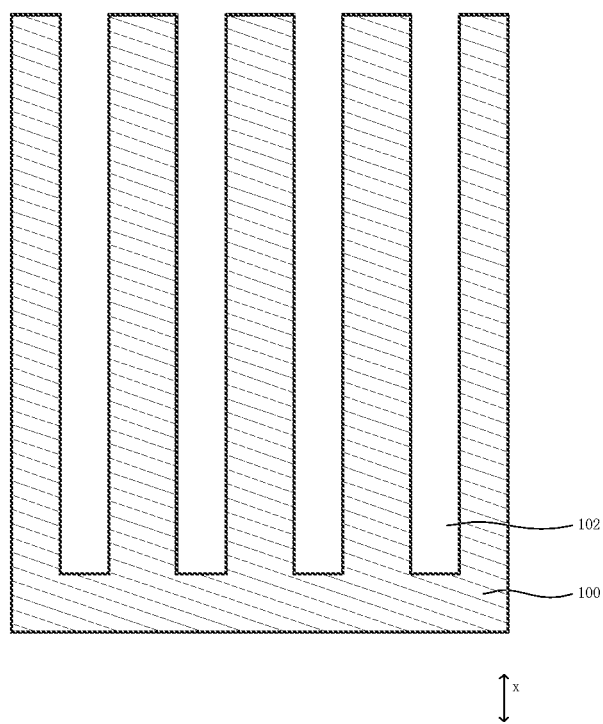
FIG. 3C is a cross-section diagram of position BB in FIG. 3A.

At step J11, a plurality of bit line slots are formed on the substrate. The plurality of bit line slots are disposed in parallel. The structure formed in this step is as shown in FIG. 3A, FIG. 3B, and FIG. 3C. In the structure formed in this step, a plurality of bit line slots 102 are disposed on the substrate 100 in parallel; and each bit line slot 102 extends along an x direction.

Figure 4A:
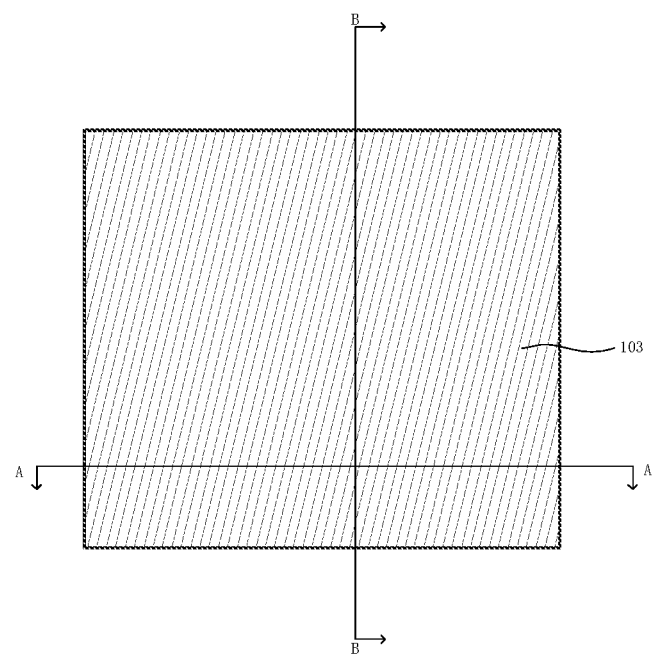
FIG. 4A is a structural schematic diagram of disposing first insulation materials in the bit line slots according to the embodiments of the present disclosure.
Figure 4B:
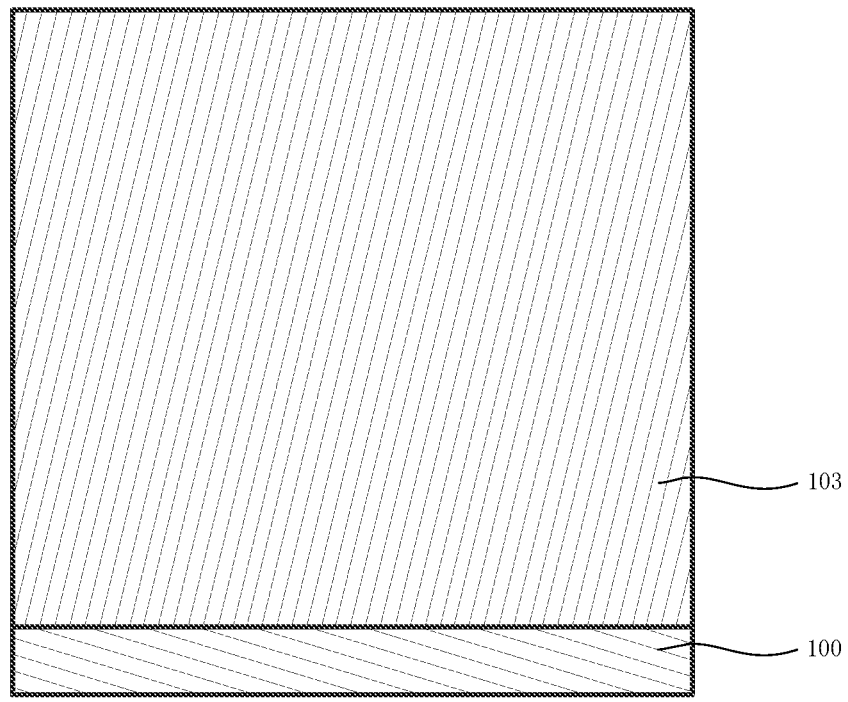
FIG. 4B is a cross-section diagram of position AA in FIG. 4A.
Figure 4C:
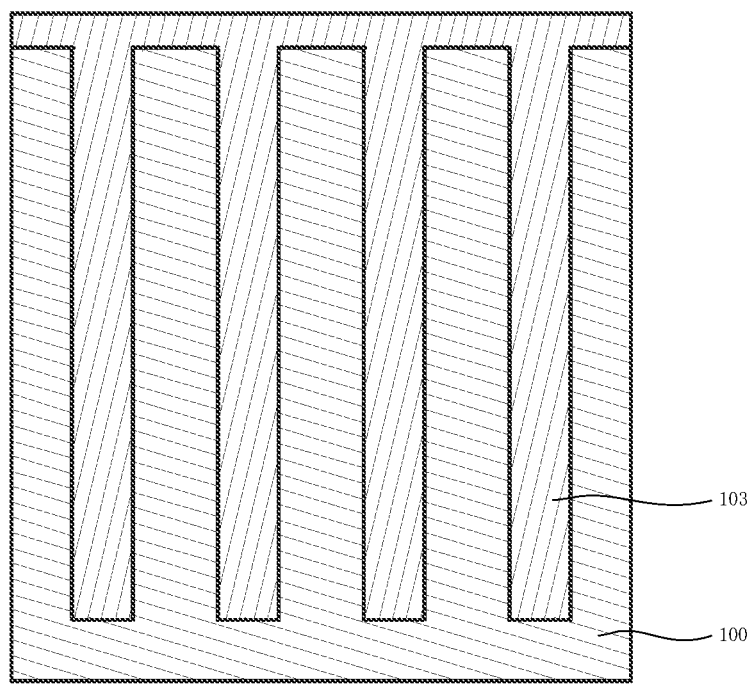
FIG. 4C is a cross-section diagram of position BB in FIG. 4A.

At step J12, each bit line slot 102 is filled with a first insulation material 103 and the first insulation material 103 is further disposed at the top surface of the substrate 100. The first insulation material 103 may be, for example, an oxide. The structure formed in this step is as shown in FIG. 4A, FIG. 4B, and FIG. 4C. In the structure formed in this step, the bit line slot 102 is filled with the first insulation material 103, and the first insulation material 103 is further disposed on the top surface of the substrate 100.

Figure 5A:
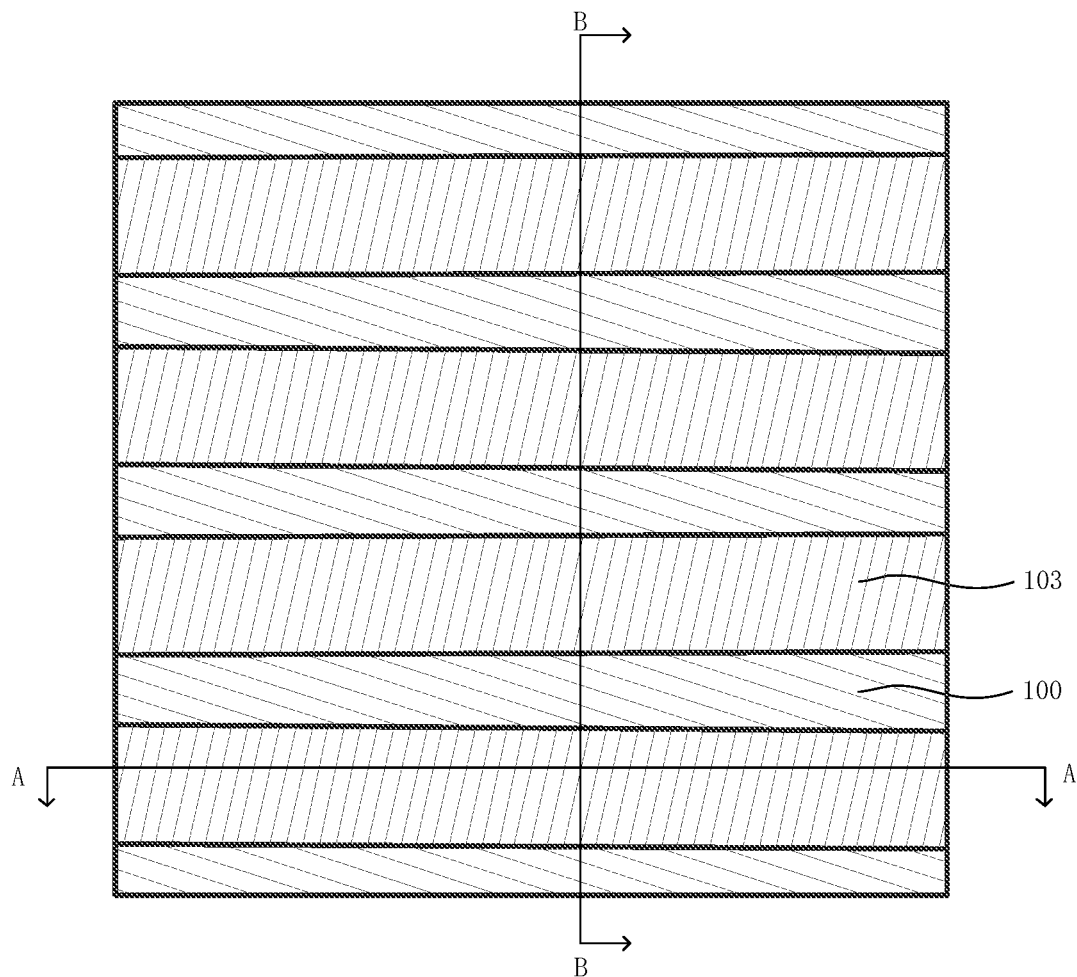
FIG. 5A is a structural schematic diagram after removing the first insulation material close to slot opening position in the bit line slot according to the embodiments of the present disclosure.
Figure 5B:
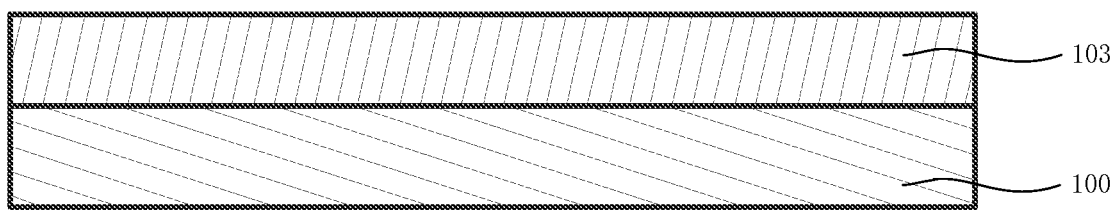
FIG. 5B is a cross-section diagram of position AA in FIG. 5A.
Figure 5C:
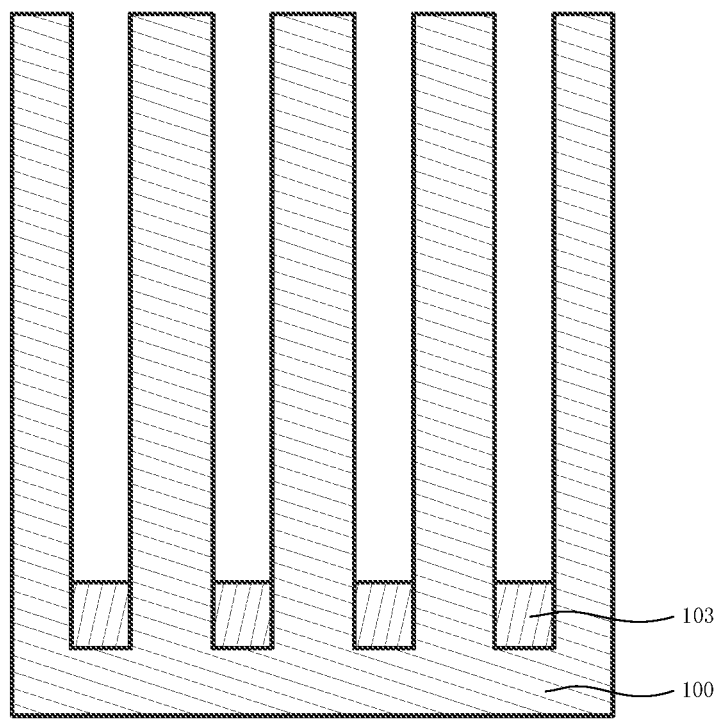
FIG. 5C is a cross-section diagram of position BB in FIG. 5A.

At step J13, the first insulation material 103 on the top surface of the substrate 100 and a part of the first insulation material 103 close to a slot opening in each bit line slot 102 are removed. The structure formed in this step is as shown in FIG. 5A, FIG. 5B, and FIG. 5C. In the structure formed in this step, the top surface of the first insulation material 103 filling the bit line slot 102 is lower than the top surface of the substrate 100. For example, the depth of the bit line slot 102 is 240-300 nanometers (nm), and the thickness of the reserved first insulation material 103 is 20-30 nm.

Figure 6A:
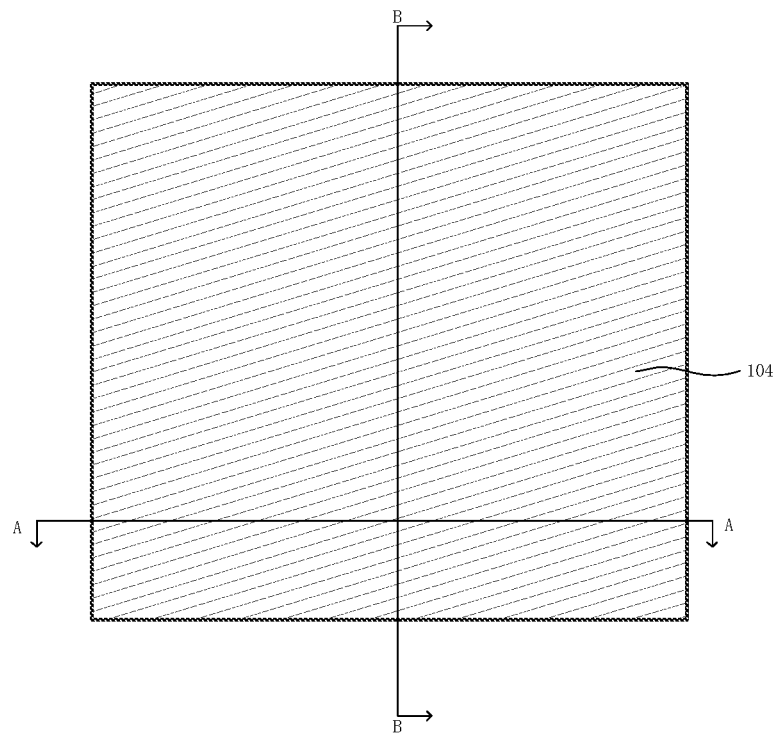
FIG. 6A is a structural schematic diagram after disposing conductive materials in the bit line slots according to the embodiments of the present disclosure.
Figure 6B:
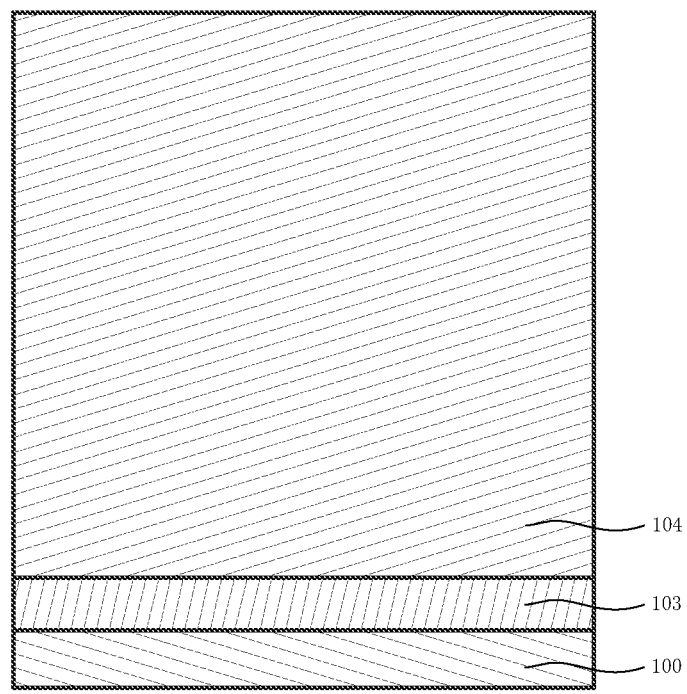
FIG. 6B is a cross-section diagram of position AA in FIG. 6A.
Figure 6C:
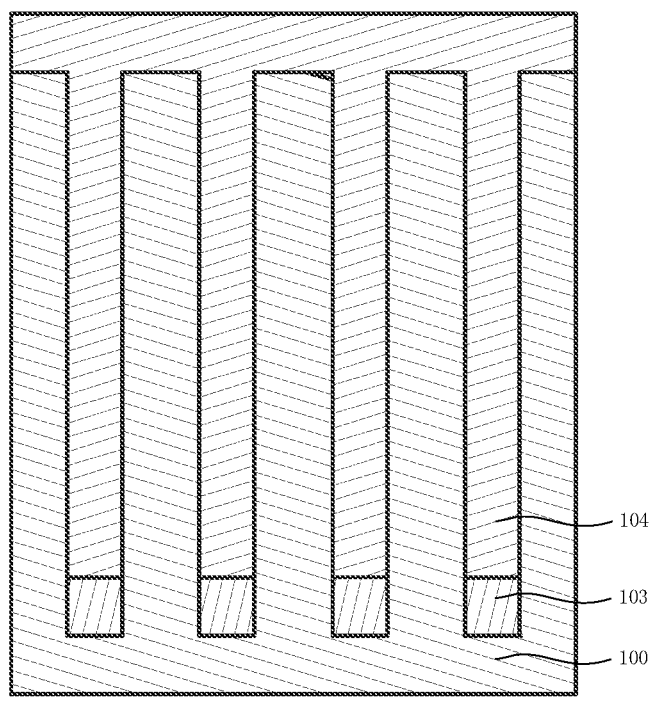
FIG. 6C is a cross-section diagram of position BB in FIG. 6A.

At step J14, a conductive material 104 is disposed on the first insulation material 103 in each bit line slot 102 and on the substrate 100. The conductive material 104 may be, for example, tungsten. The structure formed in this step is as shown in FIG. 6A, FIG. 6B, and FIG. 6C. In the structure formed in this step, the conductive material 104 is disposed on the first insulation material 103 in the bit line slot 102 and the top surface of the substrate 100.

Figure 7A:
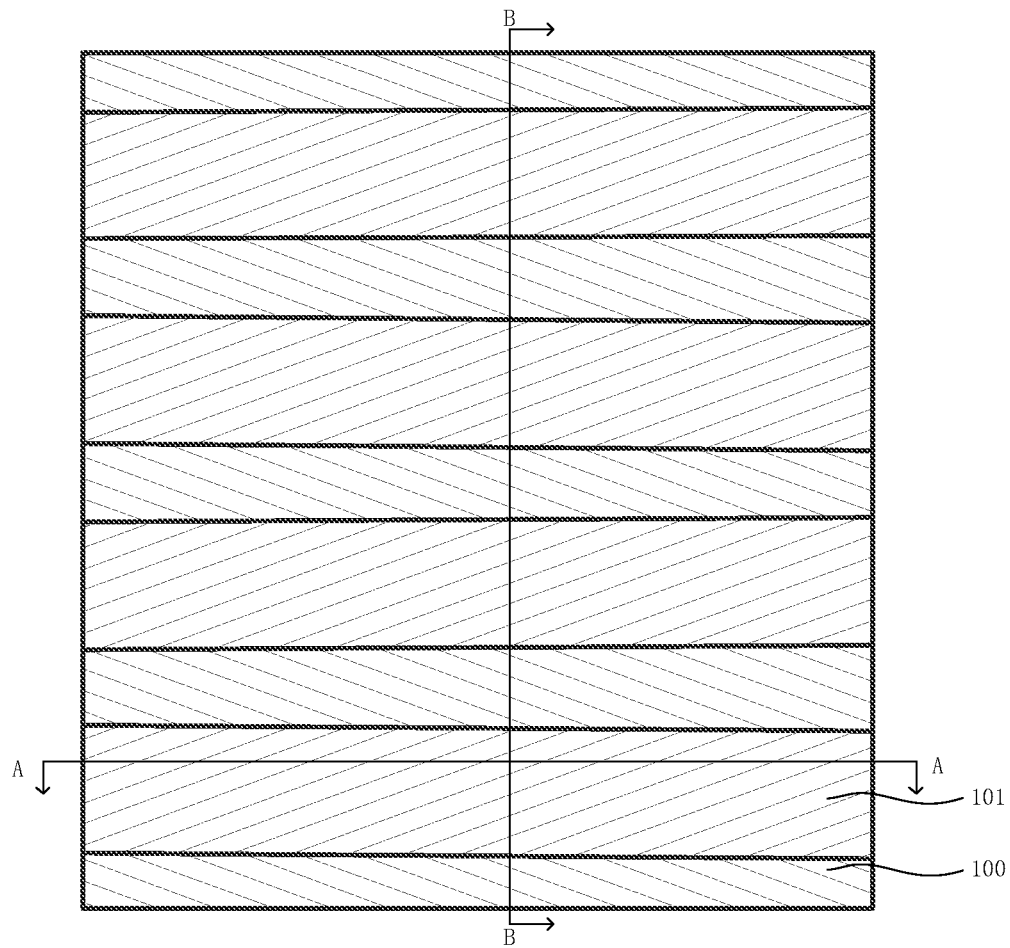
FIG. 7A is a structural schematic diagram after forming the bit lines in the bit line slots according to the embodiments of the present disclosure.
Figure 7B:
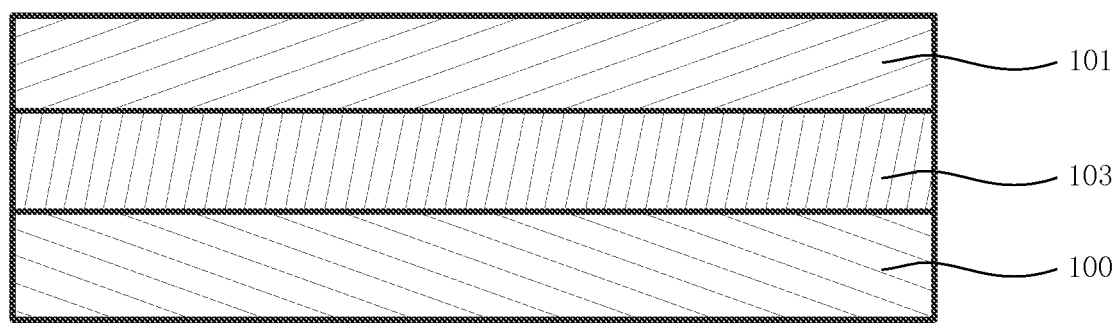
FIG. 7B is a cross-section diagram of position AA in FIG. 7A.
Figure 7C:
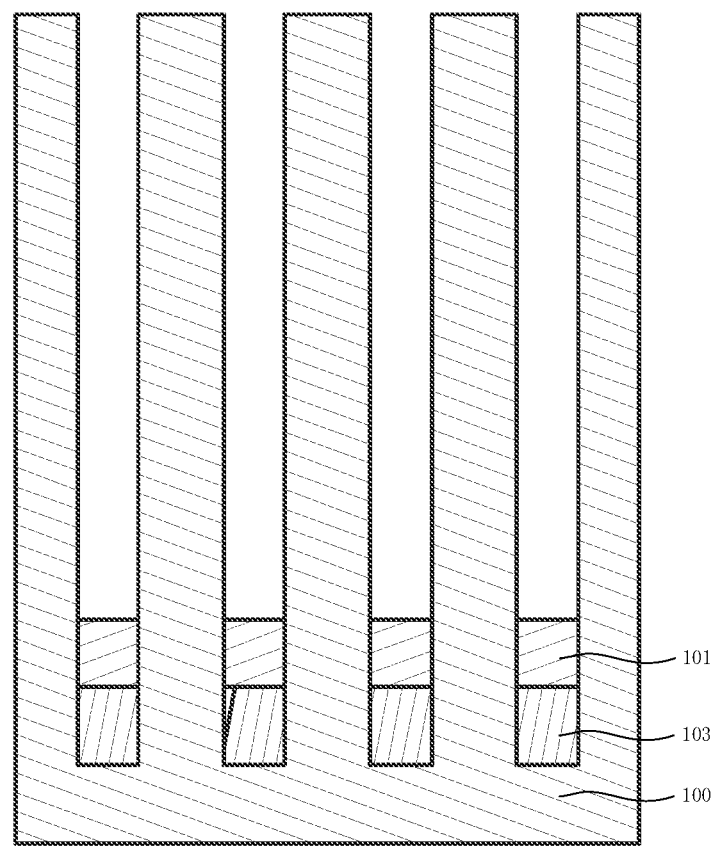
FIG. 7C is a cross-section diagram of position BB in FIG. 7A.

At step J15, the conductive material 104 on the top surface of the substrate 100 and a part of the conductive material 104 close to a slot opening position in each bit line slot 102 are removed, and the conductive material 104 in the bit line slot 102 is reserved to form the bit line 101. The structure formed in this step is as shown in FIG. 7A, FIG. 7B, and FIG. 7C. In the structure formed in this step, the reserved conductive material 104 is disposed on the first insulation material 103. The top surface of the conductive material 104 in the bit line slot 102 is lower than the top surface of the substrate 100. For example, the depth of the reserved conductive material 104 is 20 nm; and at this time, the top surface of the conductive material 104 in the bit line slot 102 is lower than the top surface of the substrate 100.

In some embodiments, the step of forming the isolation layer 200 on the substrate 100 includes: forming an insulation layer at the bottom surface, the top surface, and two opposite side surfaces of the bit lines 101, and etching the insulation layer to form the isolation layer 200. The isolation layer 200 is packaged at the periphery of the bit line 101. The above first insulation material 103 is a part of the isolation layer 200 at the bottom surface of the bit line 101. The second insulation material below is a part of the isolation layer 200 of the top surface of the bit line 101. The third insulation material below is a part of the isolation layer 200 at two opposite sides of the bit line 101.

Figure 8:
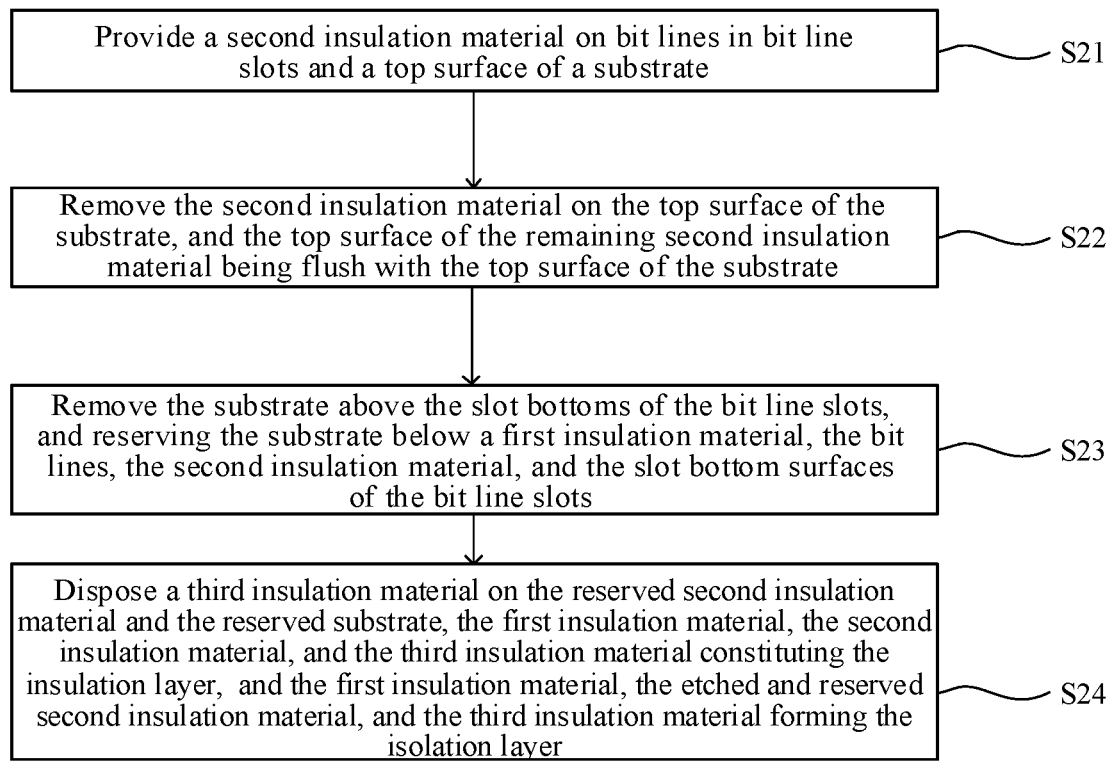
FIG. 8 is a flowchart of manufacturing of the isolation layers according to the embodiments of the present disclosure.

With reference to FIG. 8, the steps of forming the insulation layer 200 at the top surface and two opposite side surfaces of the bit lines 101, and etching the insulation layer to form the isolation layer 200 includes the following steps.

Figure 9A:
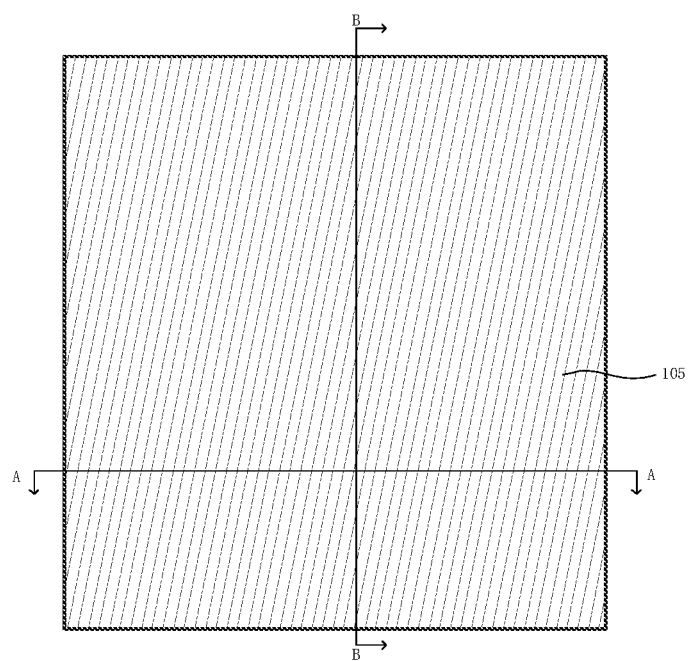
FIG. 9A is a structural schematic diagram after disposing a second insulation material in the bit line slot according to the embodiments of the present disclosure.
Figure 9B:
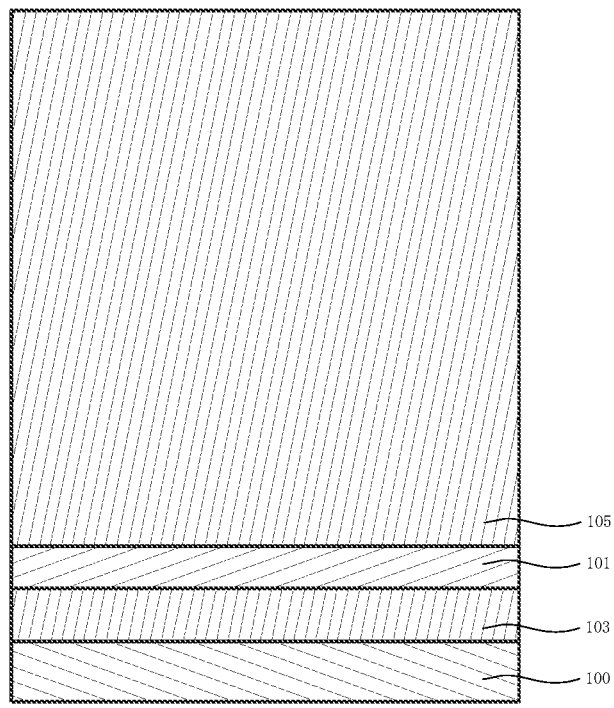
FIG. 9B is a cross-section diagram of position AA in FIG. 9A.
Figure 9C:
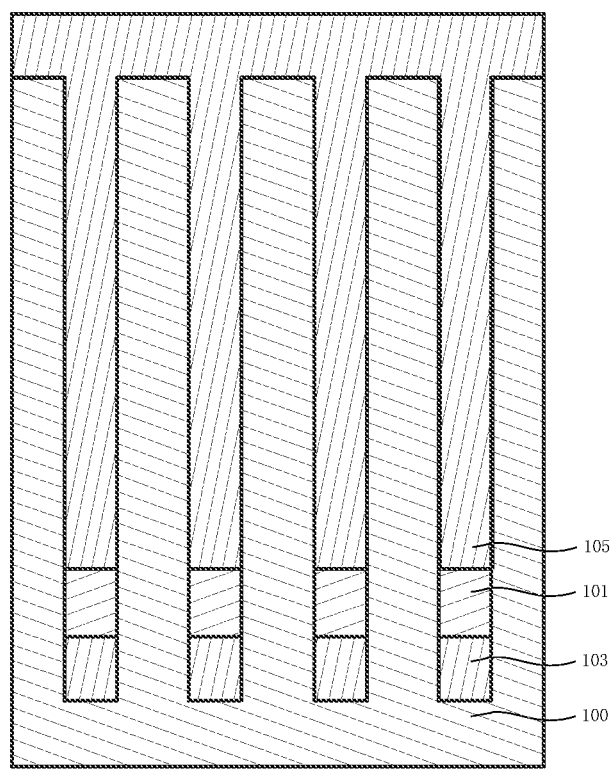
FIG. 9C is a cross-section diagram of position BB in FIG. 9A.

At step S21, a second insulation material 105 is disposed on the bit line 101 in the bit line slot 102 and the top surface of the substrate 100. The second insulation material 105 may be, for example, oxide. The structure formed in this step is as shown in FIG. 9A, FIG. 9B, and FIG. 9C. In the structure formed in this step, the second insulation material 105 is disposed on the bit line 101 in the bit line slot 102 and the top surface of the substrate 100.

Figure 10A:
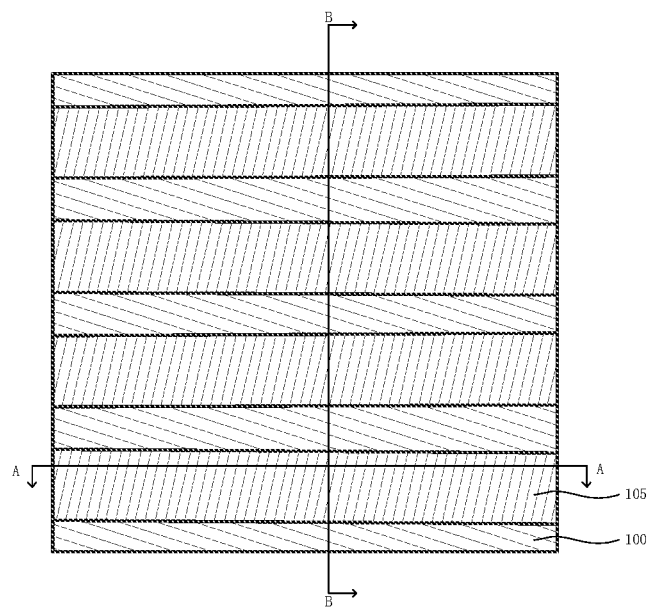
FIG. 10A is a structural schematic diagram after removing the second insulation material located on the top surface of the substrate according to the embodiments of the present disclosure.
Figure 10B:
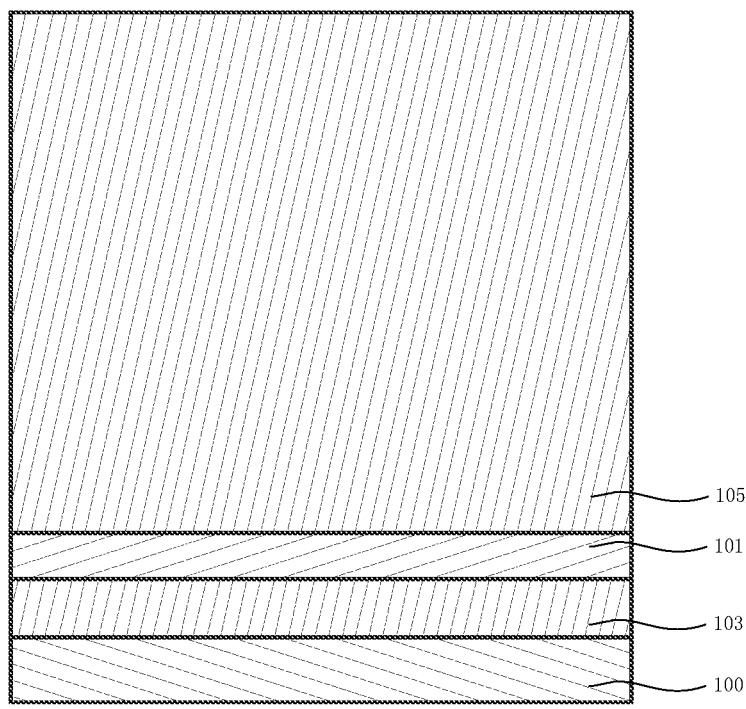
FIG. 10B is a cross-section diagram of position AA in FIG. 10A.
Figure 10C:
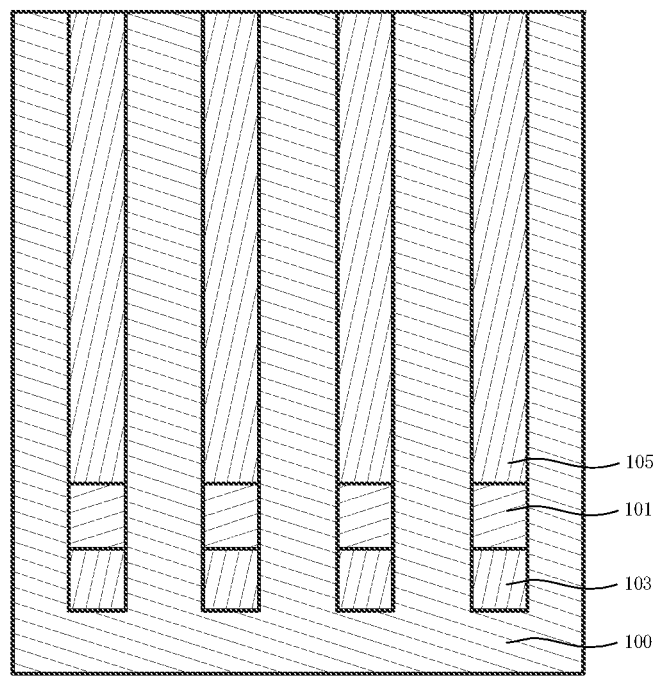
FIG. 10C is a cross-section diagram of position BB in FIG. 10A.

At step S22, the second insulation material 105 on the top surface of the substrate 100 is removed, and the top surface of the remaining second insulation material 105 is flush with the top surface of the substrate 100. The structure formed in this step is as shown in FIG. 10A, FIG. 10B, and FIG. 10C. In the structure formed in this step, the first insulation material 103, the bit line 101, and the second insulation material 105 are sequentially laminated in the bit line slot 102. The top surface of the second insulation material 105 is flush with the top surface of the substrate 100.

Figure 11A:
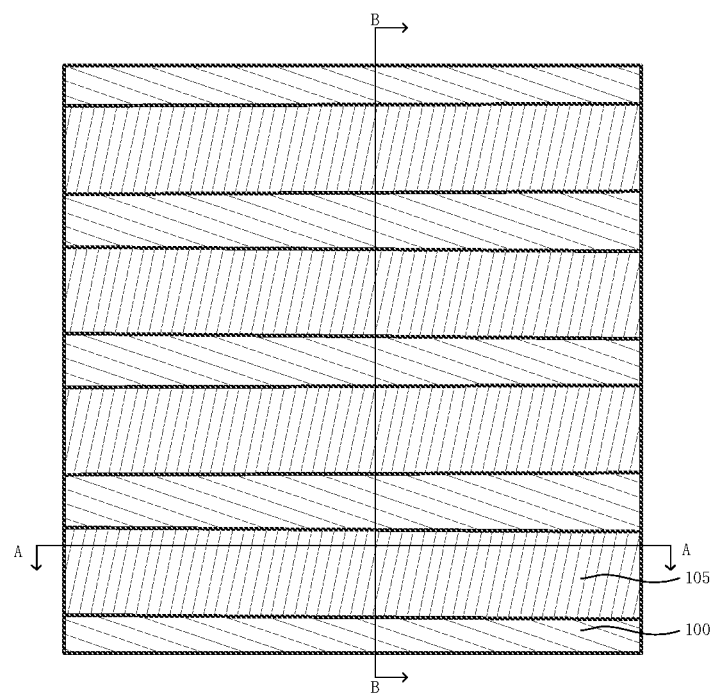
FIG. 11A is a structural schematic diagram after removing a part of the substrate according to the embodiments of the present disclosure.
Figure 11B:
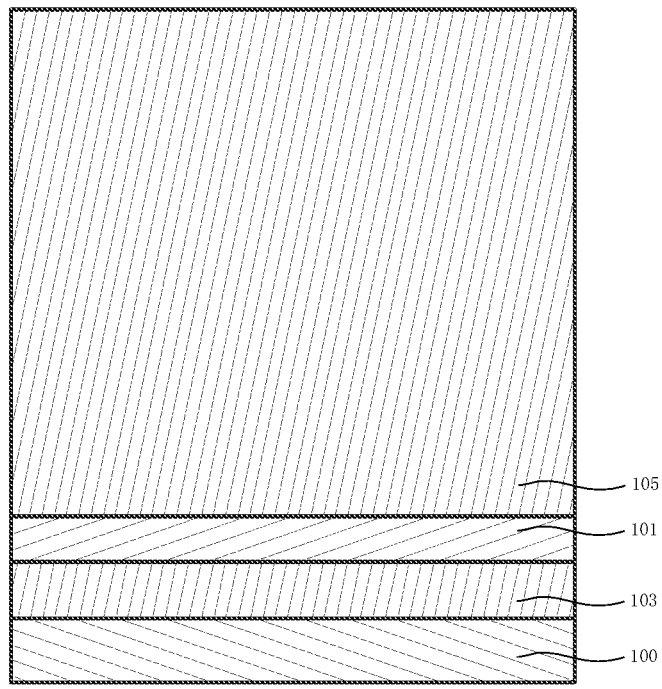
FIG. 11B is a cross-section diagram of position AA in FIG. 11A.
Figure 11C:
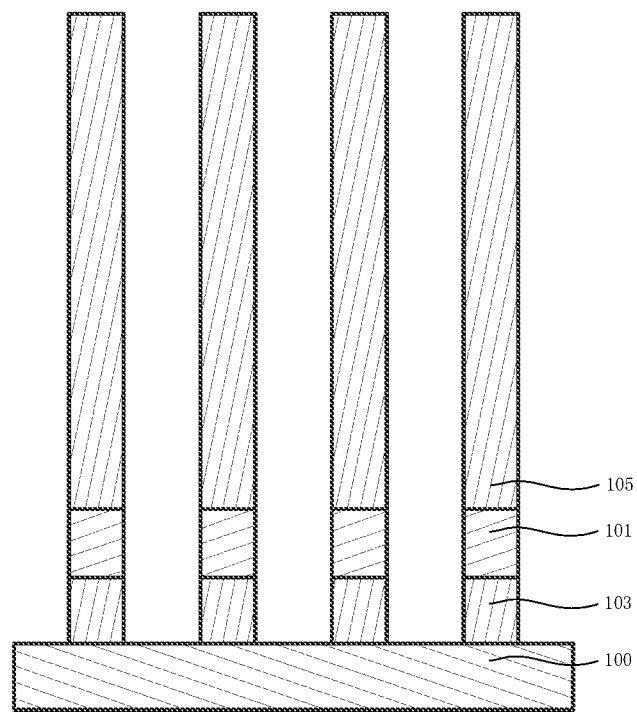
FIG. 11C is a cross-section diagram of position BB in FIG. 11A.

At step S23, the substrate 100 on the slot bottoms of the bit line slots 102 is removed, and the substrate 100 below the first insulation material 103, the bit lines 101, the second insulation material 105, and the slot bottom surfaces of the bit line slots 102 is reserved. The structure formed in this step is as shown in FIG. 11A, FIG. 11B, and FIG. 11C. In the structure formed in this step, the top surface of the reserved substrate 100 is flush with the bottom surface of the first insulation material 103. The bit lines 101 are disposed on the first insulation material 103. The second insulation material 105 is disposed on the bit lines 101.

Figure 12A:
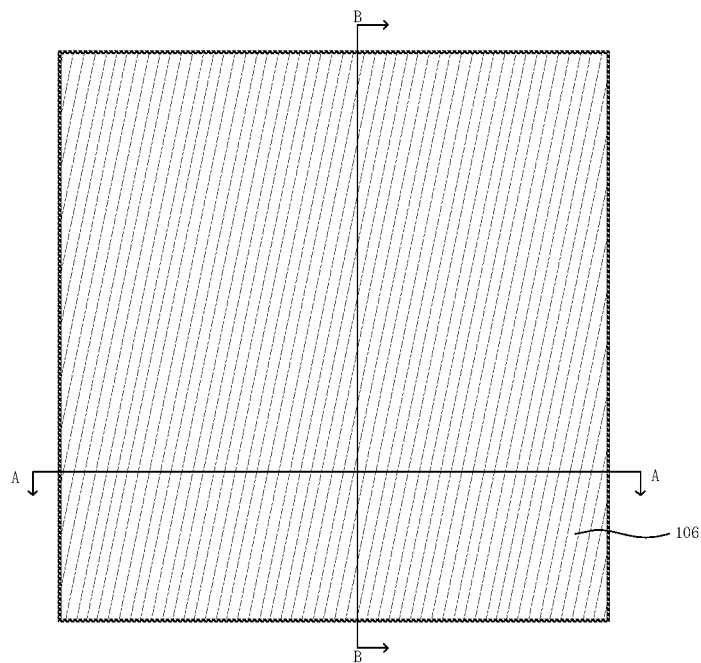
FIG. 12A is a structural schematic diagram after disposing a third insulation material on the substrate according to the embodiments of the present disclosure.
Figure 12B:
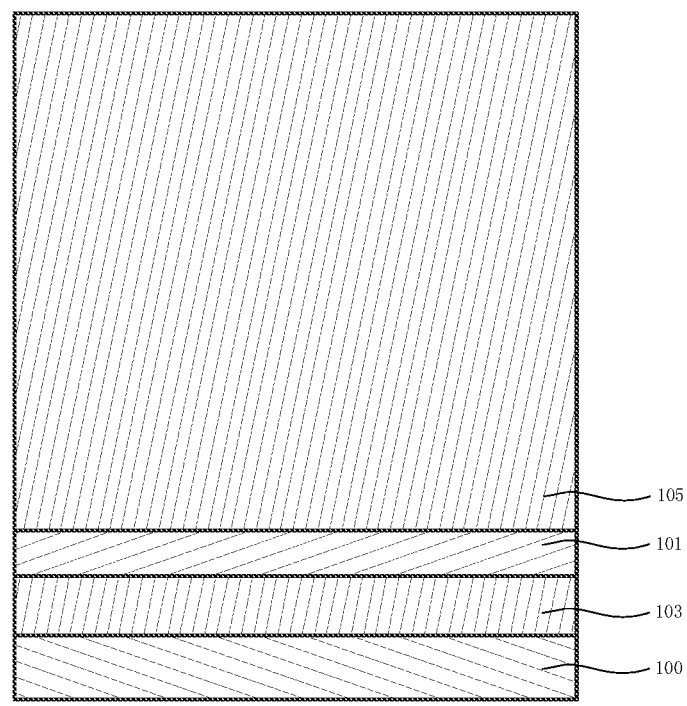
FIG. 12B is a cross-section diagram of position AA in FIG. 12A.
Figure 12C:
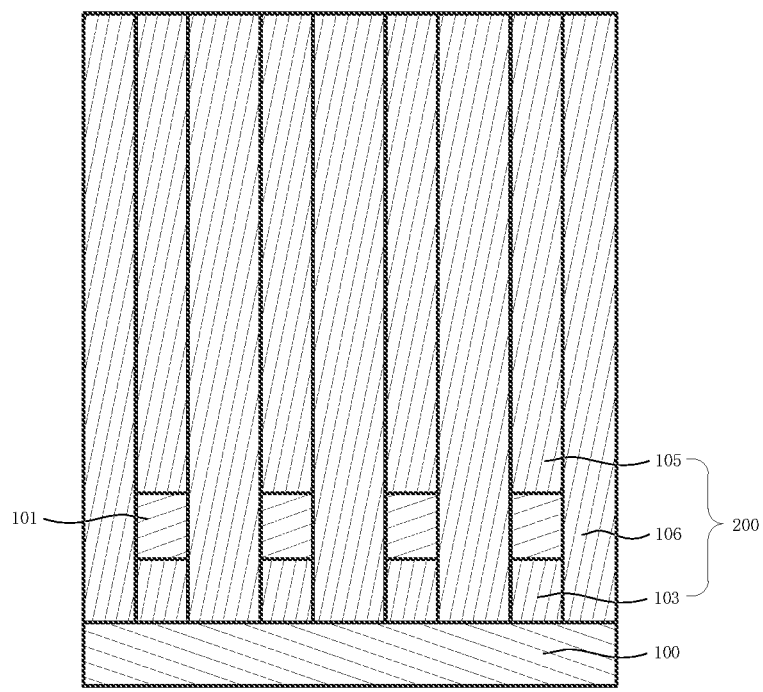
FIG. 12C is a cross-section diagram of position BB in FIG. 12A.

At step S24, a third insulation material 106 is disposed on the reserved second insulation material 105 and the reserved substrate 100, the first insulation material 103, the second insulation material 105, and the third insulation material 106 constitute the above insulation layer, and the first insulation material 103, the etched and reserved second insulation material 105, and the third insulation material 106 form the isolation layer 200. The third insulation material 106 may be, for example, oxide. The structure formed in this step is as shown in FIG. 12A, FIG. 12B, and FIG. 12C. In the structure formed in this step, the first insulation material 103 and the third insulation material 106 disposed at intervals are disposed on the substrate 100. The bit line 101 is disposed on the first insulation material 103. The second insulation material 105 is disposed on the bit line 101. The top surface of the second insulation material 105 is flush with the top surface of the third insulation material 106.

Figure 13:
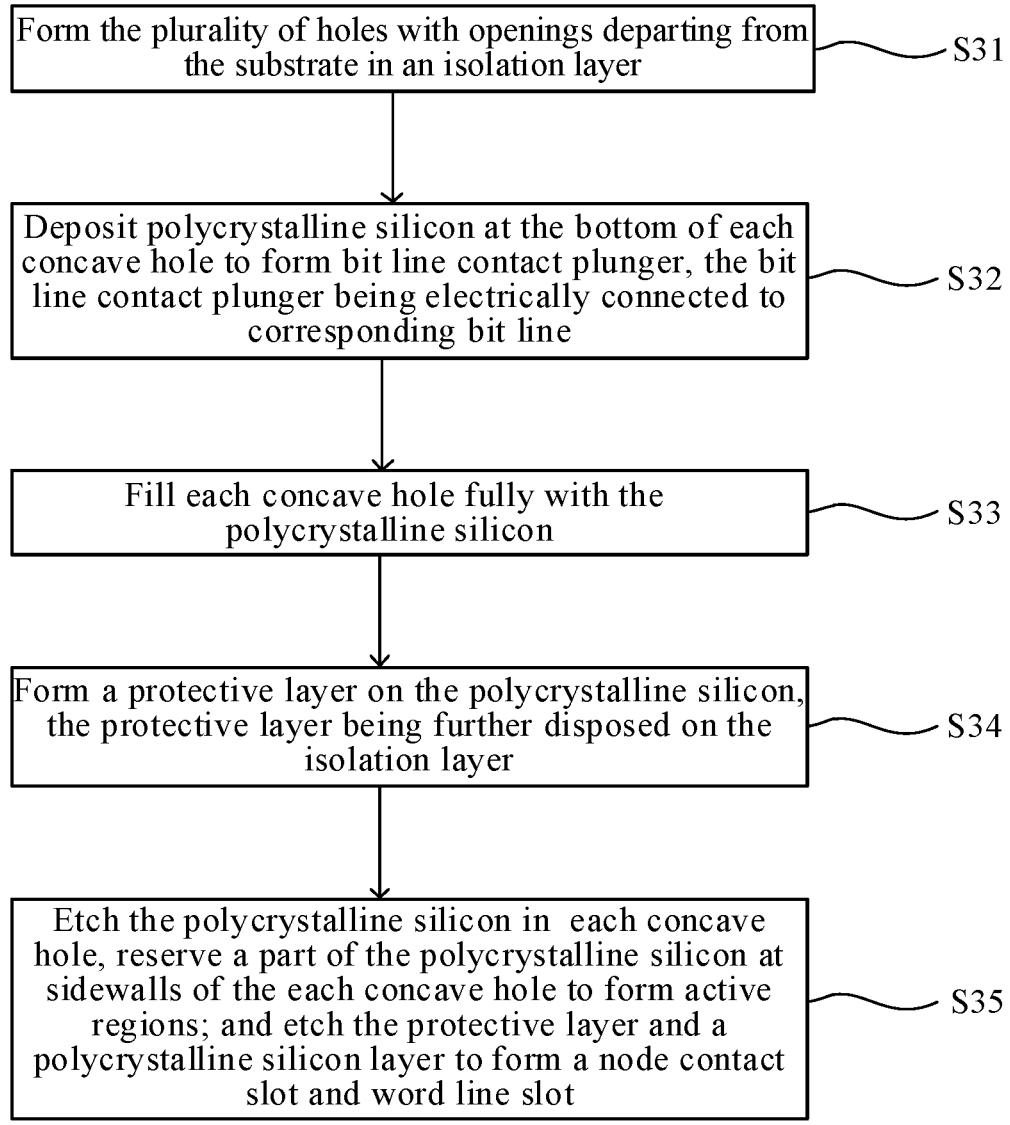
FIG. 13 is a flowchart of manufacturing of the active regions according to the embodiments of the present disclosure.

At S3, a plurality of active regions 201 arranged in an array according to rows and column are formed in the isolation layer 200. With reference to FIG. 13, the step of forming the plurality of active regions 201 arranged in the array according to rows and column in the isolation layer 200 includes the following steps.

Figure 14A:
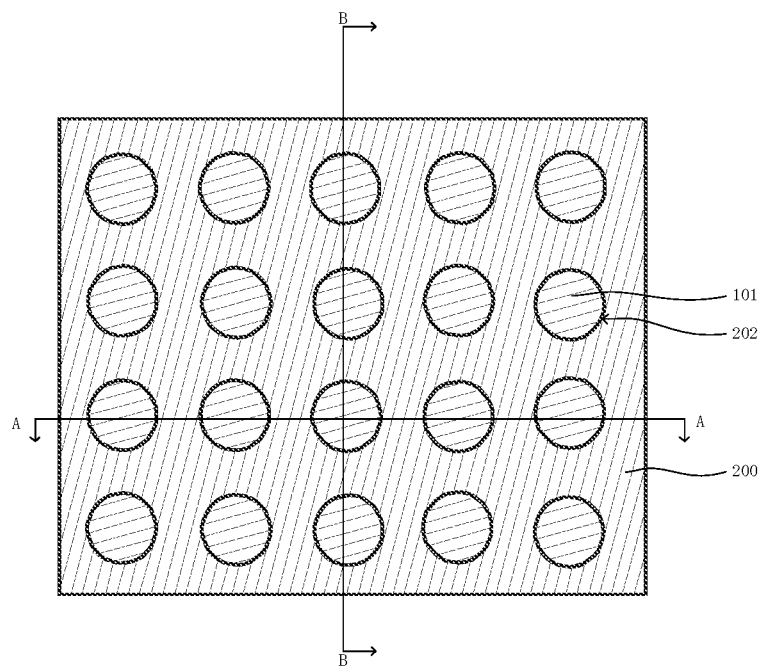
FIG. 14A is a structural schematic diagram after disposing concave holes in the isolation layer according to the embodiments of the present disclosure.
Figure 14B:
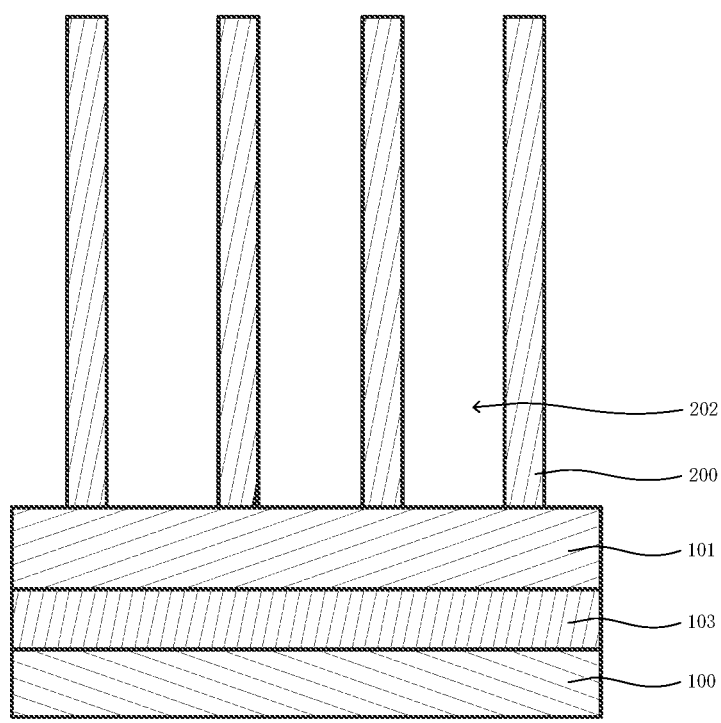
FIG. 14B is a cross-section diagram of position AA in FIG. 14A.
Figure 14C:
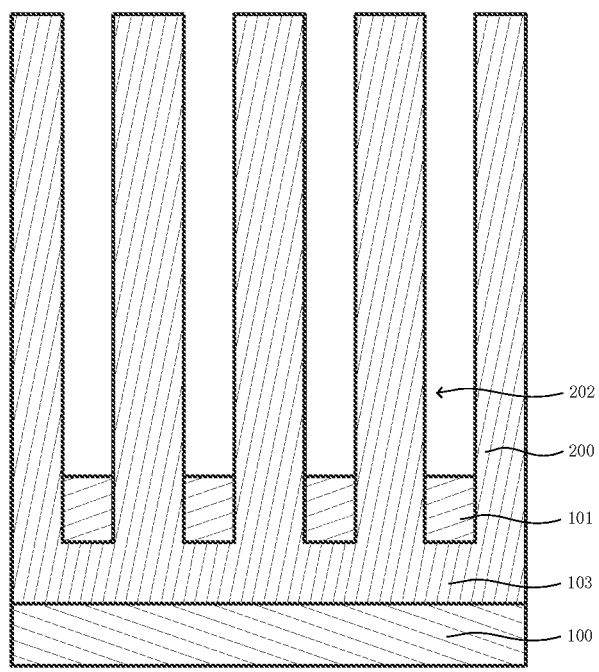
FIG. 14C is a cross-section diagram of position BB in FIG. 14A.

At S31, the plurality of concave holes 202 with openings departing from the substrate 100 are formed in the isolation layer 200. The structure formed in this step is as shown in FIG. 14A, FIG. 14B, and FIG. 14C. In the structure formed in this step, the concave holes 202 are disposed in the isolation layer 200. The concave holes 202 are arranged in an array according to columns and rows. The bottom of the concave hole 202 exposes the bit line 101 and the concave holes 202 located at the same row expose the same bit line 101.

At step S33, each concave hole 202 is fully filled with the second polycrystalline silicon 203.

At step S35, the second polycrystalline silicon 203 in each concave hole 202 is etched and a part of the second polycrystalline silicon 203 at sidewalls of the each concave hole 202 is reserved to form the active regions 201. The protective layer 204 and the second polycrystalline silicon layer 203 are etched to form node contact slot and word line slot.

Figure 17A:
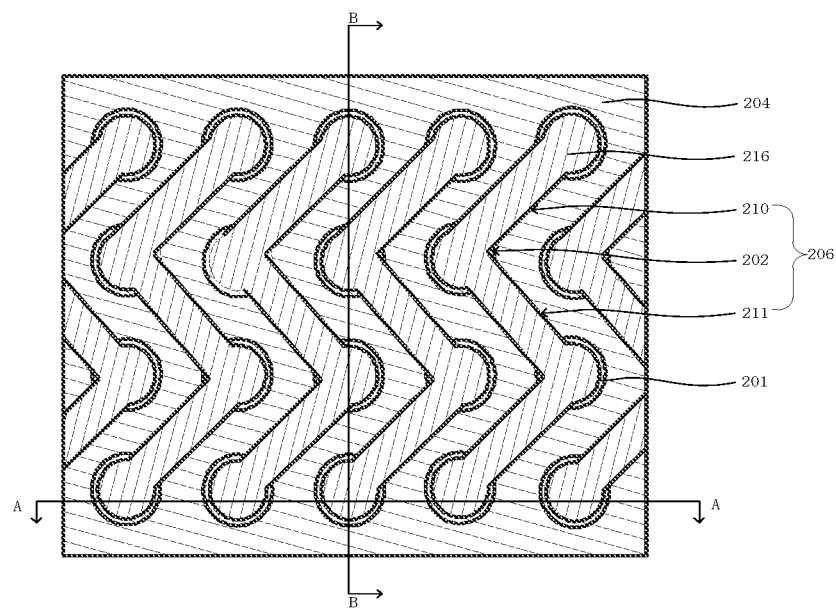
FIG. 17A is a structural schematic diagram after etching the polycrystalline silicon and disposing a first dielectric layer according to the embodiments of the present disclosure.
Figure 17B:
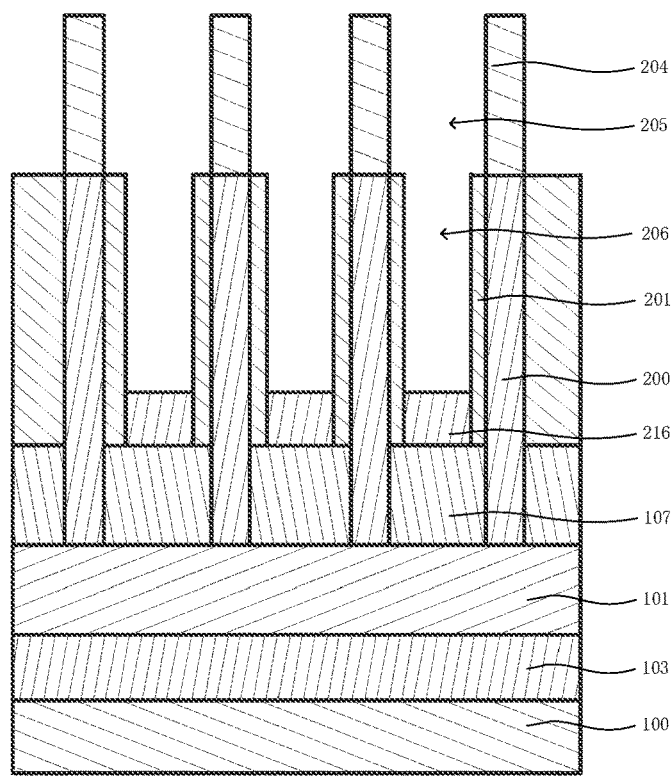
FIG. 17B is a cross-section diagram of position AA in FIG. 17A.

In some embodiments, the second polycrystalline silicon 203 in each concave hole 202 is etched and a part of the second polycrystalline silicon 203 at sidewalls of the each concave hole 202 is reserved to form the active regions 201. The active regions 201 reserved in the plurality of concave holes 202 are arranged in the array and are isolated from each other. In this step, ion doping may be performed on the second polycrystalline silicon 203. The structure formed in this step is as shown in FIG. 17A and FIG. 17B. In the structure formed in this step, one active region 201 is formed in each concave hole 202. The active region 201 in each concave hole 202 is disposed on the sidewalls of the concave hole 202.

With reference to FIG. 13, after forming the plurality of concave holes 202 with the openings departing from the substrate 100 in the isolation layer 200 and before filling each concave hole 202 fully with second polycrystalline silicon 203, the following steps are included.

Figure 15A:
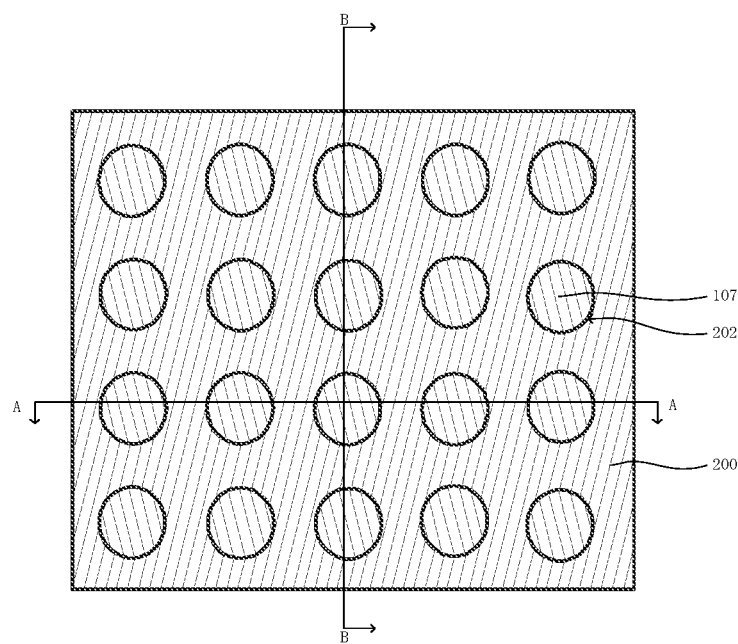
FIG. 15A is a structural schematic diagram of forming bit line contact plungers in the concave holes according to the embodiments of the present disclosure.
Figure 15B:
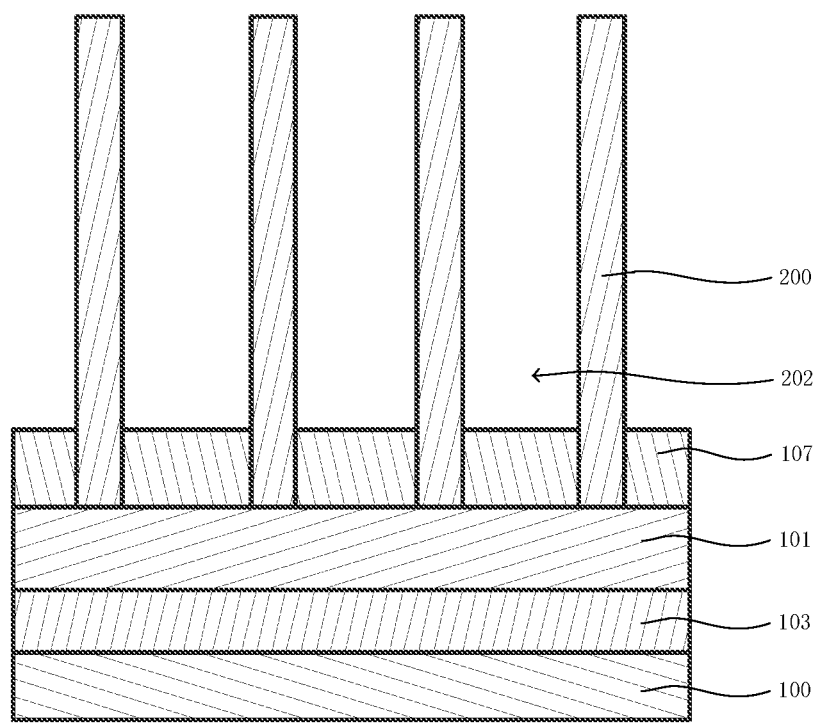
FIG. 15B is a cross-section diagram of position AA in FIG. 15A.
Figure 15C:
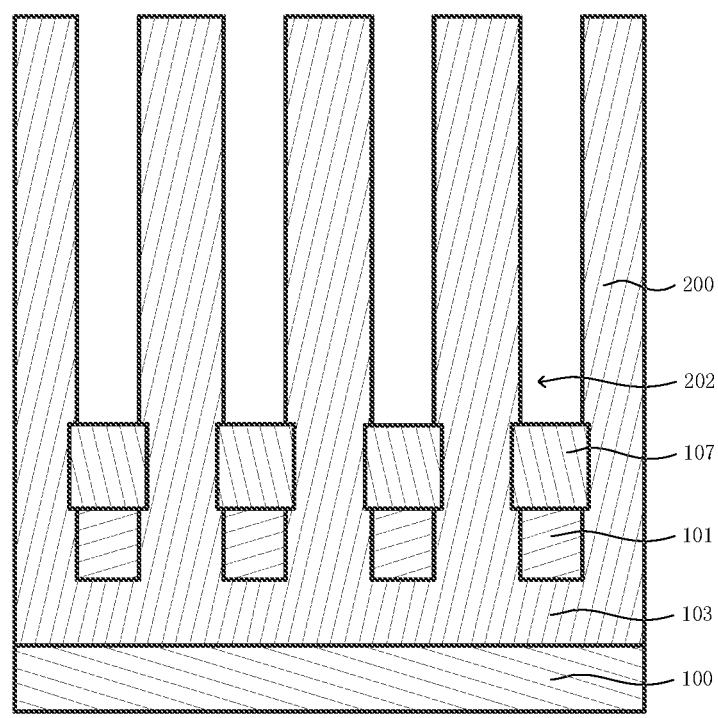
FIG. 15C is a cross-section diagram of position BB in FIG. 15A.

At step S32, first polycrystalline silicon is deposited at the bottom of each concave hole 202 to form bit line contact plunger 107, and the bit line contact plunger 107 is electrically connected to corresponding bit line 101. The deposition of the first polycrystalline silicon at the bottom of each concave hole 202 may be implemented by deposition using a Chemical Vapor Deposition (CVD) method. Then ion doping is performed to form the bit line contact plunger 107. The structure formed in this step is as shown in FIG. 15A, FIG. 15B, and FIG. 15C. In the structure formed in this step, each concave hole 202 is filled with the first polycrystalline silicon. The bottom surface of the first polycrystalline silicon is electrically contact with the bit line 101. The top surface of the first polycrystalline silicon is lower than the top surface of the isolation layer 200. The first polycrystalline silicon formed in the concave hole 202 constitutes the bit line contact plunger 107. The second polycrystalline silicon 203 in step S33 is disposed on the top surface of the bit line contact plunger 107. The second polycrystalline silicon 203 is formed on the bit line contact plunger 107 and fully fills the concave hole 202.

With reference to FIG. 13, after filling the each concave hole 202 fully with second polycrystalline silicon 203 and before etching the second polycrystalline silicon 203 in the each concave hole 202, the method further includes the following steps.

Figure 16A:
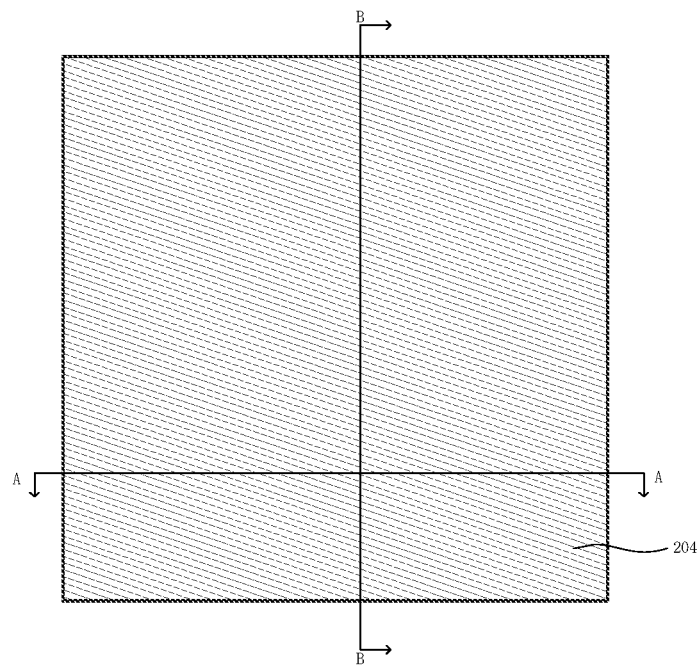
FIG. 16A is a structural schematic diagram after filling the concave holes with polycrystalline silicon according to the embodiments of the present disclosure.
Figure 16B:
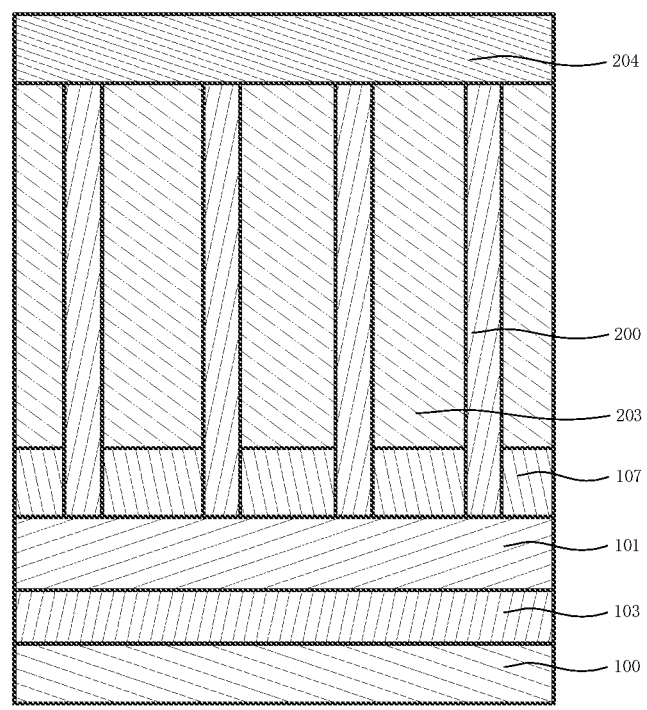
FIG. 16B is a cross-section diagram of position AA in FIG. 16A.
Figure 16C:
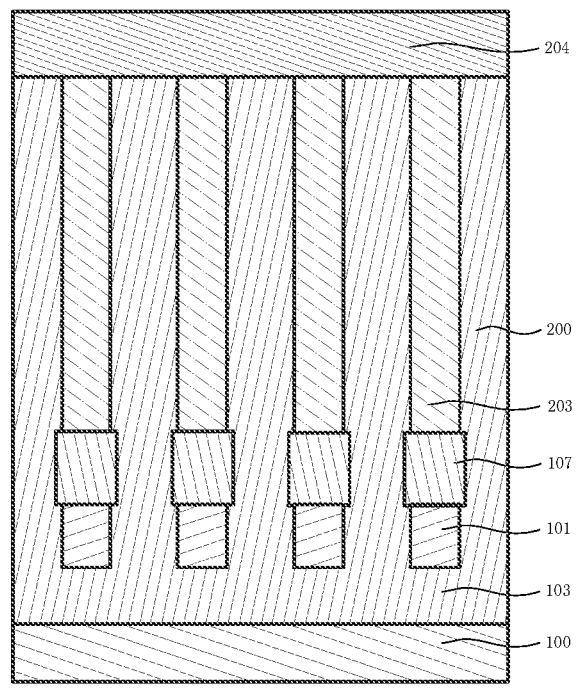
FIG. 16C is a cross-section diagram of position BB in FIG. 16A.

At step S34, a protective layer 204 is formed on the second polycrystalline silicon 203 and the protective layer 204 is further disposed on the isolation layer 200. The material of the protective layer 204 may be, for example, silicon nitride. The structure formed in this step is as shown in FIG. 16A, FIG. 16B, and FIG. 16C. In the structure formed in this step, each concave hole 202 is filled with the second polycrystalline silicon 203. The protective layer 204 is disposed on the second polycrystalline silicon 203 filling the concave hole 202 and the isolation layer 200.

With reference to FIG. 13, the step of etching the second polycrystalline silicon 203 in the each concave hole 202 further includes the following steps.

Figure 17C:
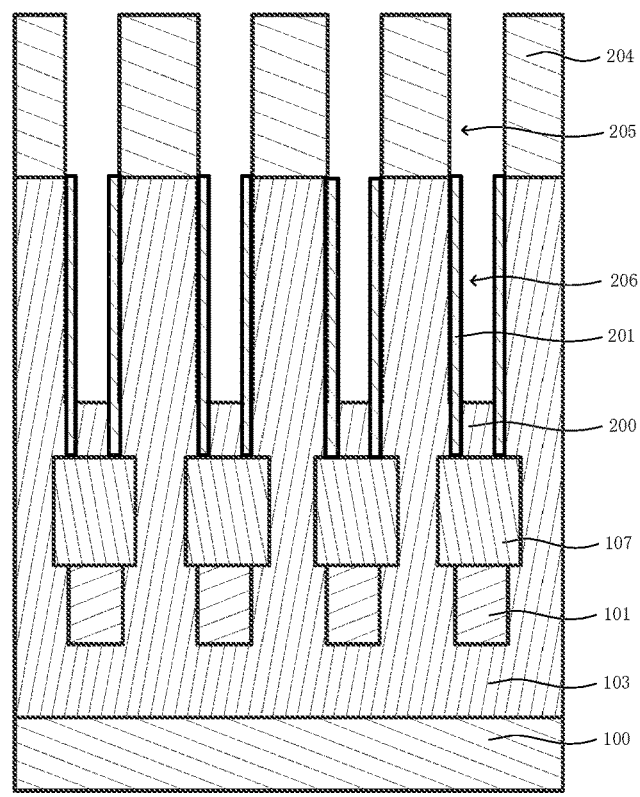
FIG. 17C is a cross-section diagram of position BB in FIG. 17A.

At step S35, in some embodiments, the protective layer 204 and the second polycrystalline silicon layer 203 are etched to form node contact slot and word line slot. The node contact slot is located over the word line slot and is communicated with the word line slot. The width of the node contact slot is greater than the width of the word line slot 206. The node contact slot is formed in the protective layer 204. The word line slot is formed in the isolation layer 200 and in the active region 201. The word line is formed in the word line slot. The node contact plunger is formed in the node contact slot. The formed node contact plunger is enabled to be electrically connected to corresponding active region 201. The structure formed in this step is as shown in FIG. 17A, FIG. 17B, and FIG. 17C. The word line slot 206 is disposed in the isolation layer 200 and the active region 201. The node contact slot 205 is disposed in the protective layer 204. The node contact slot 205 is communicated with the word line slot 206. The slot width of the node contact slot 205 is greater than the width of the word line slot 206.

The node contact plunger is formed in the node contact slot 205 and the node contact plunger may be obtained by depositing the third polycrystalline silicon through the CVD, and performing ion doping.

At step S4, a plurality of word lines are formed in the isolation layer 200 and the active region 201, the plurality of word lines are arranged along the row direction of the plurality of active regions 201, each word line is an S shape, the each word line includes gates 208 disposed in the active region 201 and word line structures 209 disposed in the isolation layer 200, the each word line 207 is constituted by successive connection of the plurality of gates and the plurality of word line structures arranged at intervals, and the plurality of gates included in each word line are located in two correspondingly adjacent columns of active region 201, and any two adjacent gates in the each word line are located in two correspondingly adjacent rows of active region 201. The structure formed in this step is as shown in FIG. 18A, FIG. 19A, FIG. 19B, and FIG. 19C. Each word line 207 is formed by the gates 208 and word line structures 209 connected at intervals. The gates 208 are disposed in the active regions 201. The word line structures 209 are disposed in the isolation later 200. The active regions 201 where each gate 208 on each word line 207 is located correspondingly at two adjacent columns, and the numbers of rows of the active regions 201 where any two adjacent gates 208 on each word line 207 are located differ from each other by one row.

Figure 20:
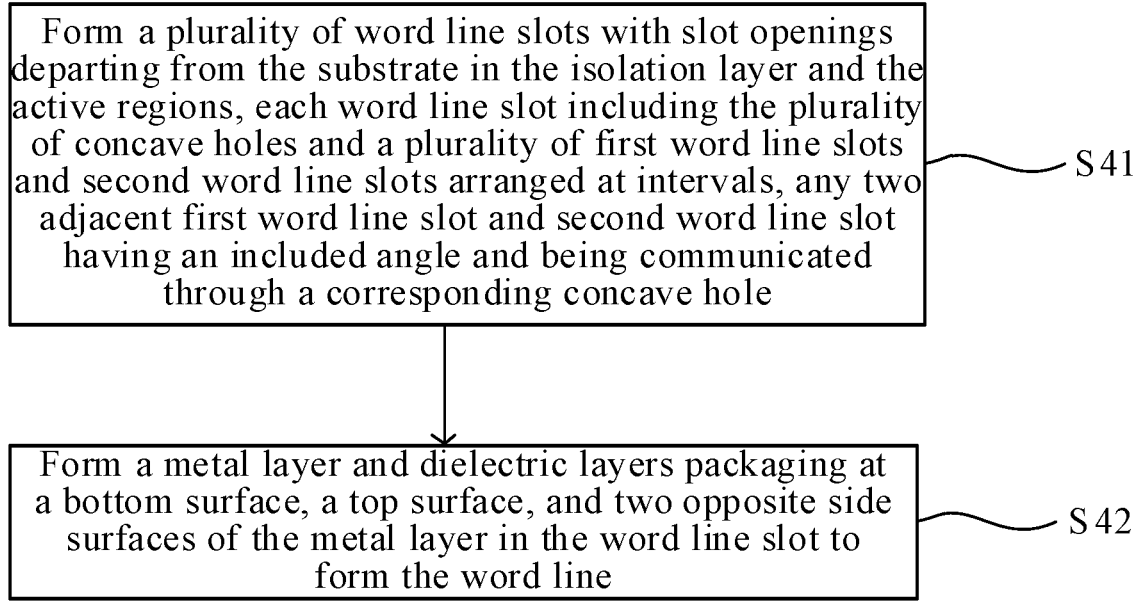
FIG. 20 is a flowchart of manufacturing of word lines according to the embodiments of the present disclosure.

With reference to FIG. 20, the step of forming the plurality of word lines 207 in the isolation layer 200 and the active region 201 includes the following steps.

At step S41, a plurality of word line slots with slot openings departing from the substrate 100 are formed in the isolation layer 200 and the active regions 201, each word line slot includes the plurality of concave holes 202 and a plurality of first word line slots and second word line slots that are arranged at intervals, any two adjacent first word line slot and second word line slot have an included angle and are communicated through a corresponding concave hole 202. The structure formed in this step is as shown in FIG. 17A, FIG. 17B, and FIG. 17C. The concave hole 202 is disposed in the active region 201. The first word line slot 210 and the second word line slot 211 are disposed in the isolation layer 200. The first word line slot 210 and the second word line slot 211 have an included angle. The first word line slot 210 is communicated with the second word line slot 211 through the concave hole 202.

At step S42, a metal layer and dielectric layers packaging at a bottom surface, a top surface, and two opposite side surfaces of the metal layer are formed in the word line slot 206 to form the word line 207. The word line 207 includes a plurality of first word line structures, a plurality of second word line structures, and a plurality of gates. The each first word line structure is formed in a corresponding first word line slot 210. The each second word line structure is formed in a corresponding second word line slot 211. The each gate is formed in a corresponding concave hole 202, and any two adjacent first word line structure and second word line structure are electrically connected through a corresponding gate. The structure formed in this step is as shown in FIG. 18A, FIG. 18B, FIG. 18C, FIG. 19A, FIG. 19B, and FIG. 19C. The gate 208 is disposed in the active region 201. The first word line structure 212 is formed in the first word line slot 210 of the isolation layer 200. The second word line structure 213 is formed in the second word line slot 211 of the isolation layer 200. The first word line structure 212 and the second word line structure 213 are connected through the gate 208.

Figure 21:
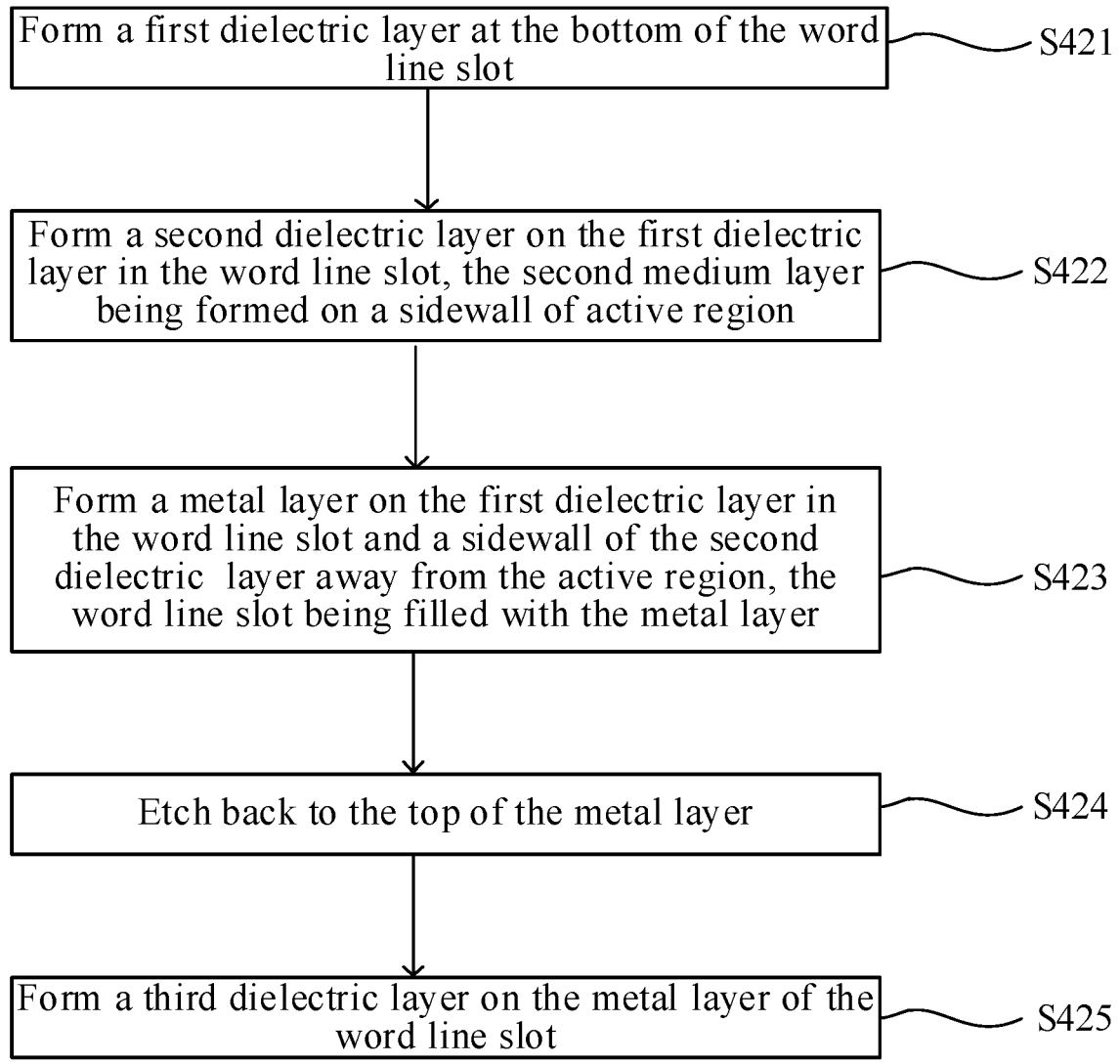
FIG. 21 is a flowchart of manufacturing of the dielectric layers according to the embodiment s of the present disclosure.

With reference to FIG. 21, the step of forming a metal layer 214 and a dielectric layers 215 packaging at the bottom surface, the top surface, and the two opposite side surfaces of the metal layer 214 in the word line slot 206 to form the word line 207 includes the following steps.

At step S421, a first dielectric layer 216 is formed at the bottom of the word line slot 206. The first dielectric layer 216 may be, for example, a silicon oxide layer. The structure formed in this step is as shown in FIG. 17A, FIG. 17B, and FIG. 17C. The material of the first dielectric layer 216 is disposed in the word line slot 206. The height of the first dielectric layer 216 is less than the slot depth of the word line slot 206. That is, the top surface of the first dielectric layer 216 is lower than the top surface of the word line slot 206.

Figure 18A:
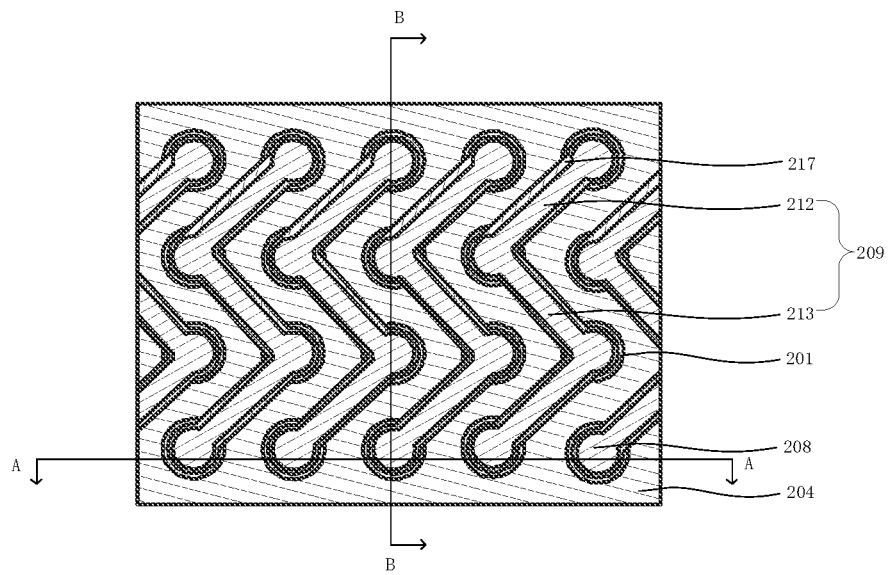
FIG. 18A is a structural schematic diagram after disposing metal layers and the second dielectric layers in the concave holes according to the embodiments of the present disclosure.
Figure 18B:
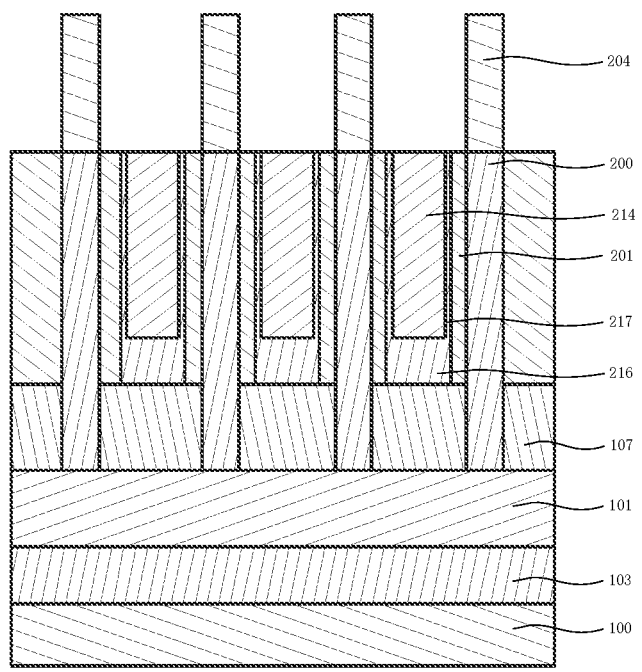
FIG. 18B is a cross-section diagram of position AA in FIG. 18A.
Figure 18C:
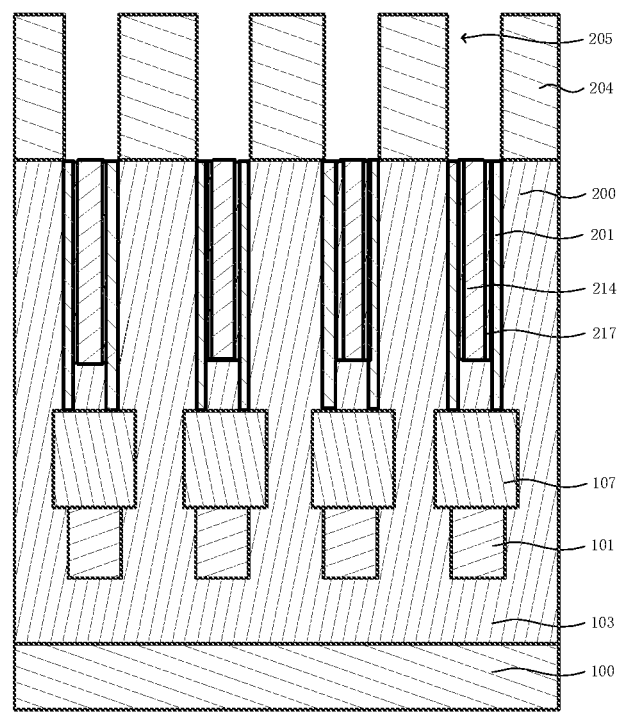
FIG. 18C is a cross-section diagram of position BB in FIG. 18A.

At step S422, a second dielectric layer 217 is formed on the first dielectric layer 216 in the word line slot 206. The second dielectric layer 217 is formed on a sidewall of the active region 201. The material of the second dielectric layer 217 may be, for example, a silicon oxide layer. The second dielectric layer 217 may be manufactured through an In-Situ Steam Generation (ISSG) method. The thickness of the second dielectric layer 217 may be about 5 nm. The structure formed in this step is as shown in FIG. 18A, FIG. 18B, and FIG. 18C. The second dielectric layer 217 is disposed in the word line slot 206. The second dielectric layer 217 is disposed on the first dielectric layer 217 and is disposed on the sidewall of the active region 201.

At step S423, the metal layer 214 is formed on the first dielectric layer 216 in the word line slot 206 and a sidewall of the second dielectric layer 217 away from the active region 201 in the word line slot 206, and the word line slot 206 is filled fully with the metal layer 214. The material of the metal layer 214 may be, for example, metal tungsten. The structure formed in this step is as shown in FIG. 18A, FIG. 18B, and FIG. 18C. The metal layer 214 is disposed in the word line slot 206. The second dielectric layer 217 is disposed at two opposite side surfaces of the metal layer 214.

Figure 19A:
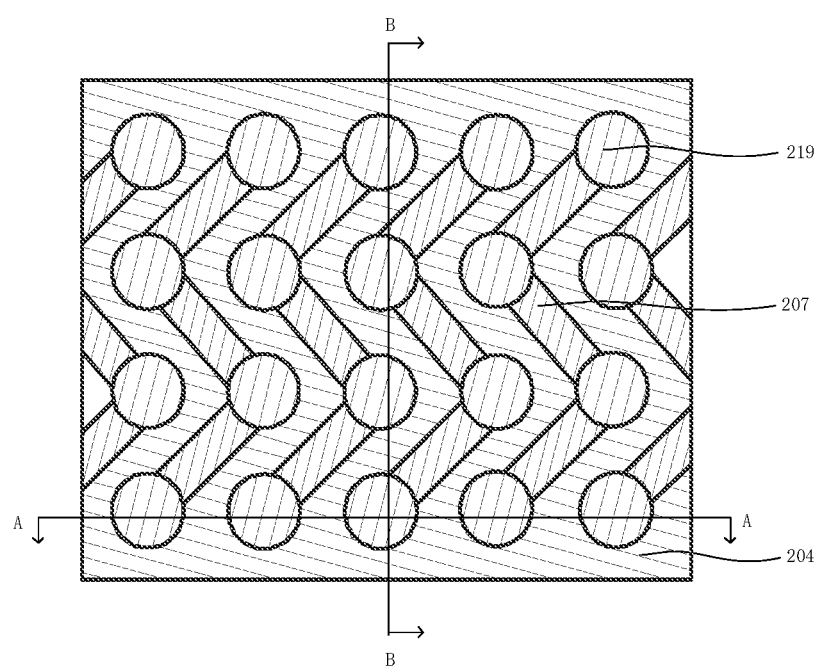
FIG. 19A is a structural schematic diagram after disposing the third dielectric layers in the concave holes and forming the node contact plungers according to the embodiments of the present disclosure.
Figure 19B:
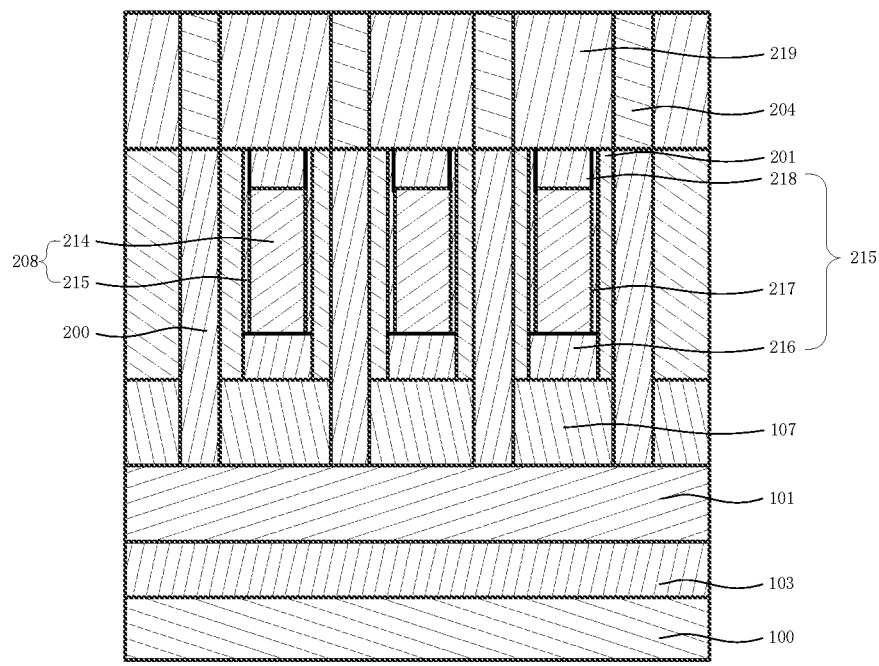
FIG. 19B is a cross-section diagram of position AA in FIG. 19A.
Figure 19C:
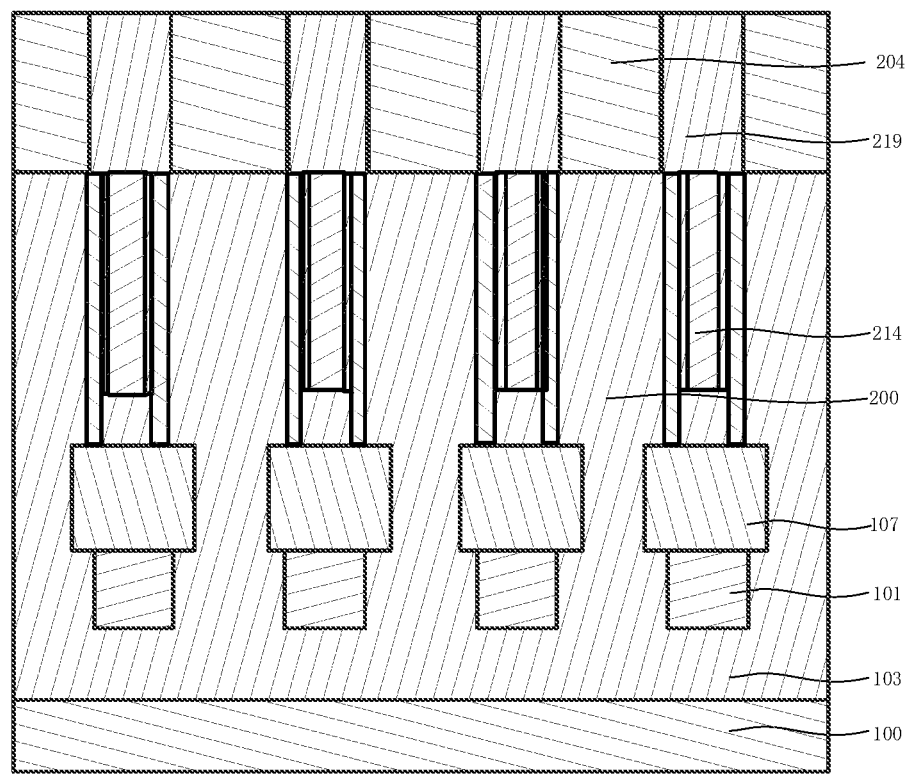
FIG. 19C is a cross-section diagram of position BB in FIG. 19A.

At S424, etching back to the top of the metal layer 214 is performed. The structure formed in this step is as shown in FIG. 19A, FIG. 19B, and FIG. 19C. The top surface of the metal layer 214 is lower than the top surface of the second dielectric layer 217.

At S425, a third dielectric layer 218 is formed on the metal layer 214 of the word line slot 206. The material of the third dielectric layer 218 may be, for example, silicon oxide. The structure formed in this step is as shown in FIG. 19A, FIG. 19B, and FIG. 19C. The third dielectric layer 218 is disposed on the metal layer 214 and the second dielectric layer 217.

For the method for manufacturing memory of the embodiments of the present disclosure, an isolation layer 200 is disposed on the substrate 100, active regions 201 are disposed in the isolation layer 200, word lines 207 are disposed in the isolation layer 200 and the active regions 201, a plurality of word lines 207 are enabled to be arranged along a row direction of the plurality of active regions 201, each word line 207 is in an S shape, the plurality of gates 208 included in each word line 207 are located in the two correspondingly adjacent columns of active regions 201, and any two adjacent gates 208 in the each word line 207 are located in two correspondingly neighboring rows of active regions 201. In this way, in the formed memory, the number of active regions 201 correspondingly disposed on the substrate 100 of a unit size is greater, the number of subsequently disposed capacitors corresponding to the active regions 201 one to one is greater, and the integration level of the memory is higher.

The memory manufactured using the method for manufacturing memory of the embodiments of the present disclosure is a 2HPAA-multiply-2HPWL structure. The 2HPAA-multiply-2HPWL determines a cell bit area. The 2HPAA-multiply-2HPWL refers to twice of a HP of the active region multiplied by twice of the HP of the word line. An area of the 4F2 storage cell formed by the 2HPAA-multiply-2HPWL structure would be reduced to about two thirds of the 6F2 storage cell formed by the 3HPAA-multiply-2HPWL structure. The storage density of the 4F2 storage structure is greater and the integration level is higher.

With reference to FIG. 18A, FIG. 18B, FIG. 18C, FIG. 19A, FIG. 19B, and FIG. 19C, the memory provided by the embodiments of the present disclosure includes a substrate 100. The material of the substrate 100 may be silicon, germanium, and the like. An isolation layer 200 is disposed on the substrate 100. The material of the isolation layer 200 may be, for example, silicon dioxide. A plurality of active regions 201 arranged in an array according to rows and columns are disposed in the isolation layer 200. A plurality of word lines 207 are formed in the plurality of active regions 201 and the isolation layer 200. The plurality of word lines 207 are arranged along the row direction of the plurality of active regions 201. Each word line 207 is in an S shape. The each word line 207 extends along the column direction of the plurality of active regions 201. The each word line 207 includes gate 208 disposed in the active region 201 and word line structure 209 disposed in the isolation layer 200. The each word line 207 is constituted by successive connection of the plurality of gates 208 and the plurality of word line structures 209 arranged at intervals. The plurality of gates 208 included in each word line 207 are disposed in two correspondingly adjacent columns of active regions 201. Any two adjacent gates 208 in the each word line 207 are disposed in two correspondingly adjacent rows of active regions 201.

For the memory of the embodiments of the present disclosure, a plurality of active regions 201 arranged in an array according to rows and columns are disposed in the isolation layer 200 of the substrate 100, a plurality of word lines 207 are disposed in the isolation layer 200 and the active regions 201, each word line 207 is in an S shape, the plurality of gates 208 and the plurality of word line structures 209 included in each word line 207 are successively disposed at interval and connected, the plurality gates 208 in each word line 207 are successively and alternatively disposed in the two correspondingly adjacent columns of active regions 201, and any two adjacent gates 208 in the each word line 207 are disposed in two correspondingly adjacent rows of active regions 201. In this way, the number of active regions 201 disposed in the isolation layer 200 on the substrate 100 of a unit size is greater, the number of subsequently disposed capacitors corresponding to the active regions 201 one to one is greater, and the integration level of the memory is higher.

With reference to FIG. 18A, FIG. 18B, FIG. 18C, FIG. 19A, FIG. 19B, and FIG. 19C, the word line structures 209 includes the first word line structures 212 and the second word line structures 213, in each word line 207, an end of any one first word line structure and an end of any one second word line structure that are adjacent are electrically connected through a corresponding gate, the first word line structures 212 extend along a first direction, the first direction is disposed at an acute angle with respect to a row direction and a column direction of the plurality of active regions 201, the second word line structures 213 extend along a second direction, and the second direction is disposed at an acute angle with respect to the row direction and the column direction of the plurality of active regions 201. The first word line structure 212 and the second word line structure 213 that are adjacent are disposed at an acute angle.

For the memory of this embodiment, the word line structures 209 include the first word line structures 212 and the second word line structures 213, an end of any one first word line structure 212 and an end of any one second word line structure 213 that are adjacent are connected through the gate 208, the first word line structure 212 and the second word line structure 213 are disposed at an acute angle, so as to implement the word line 207 to be in an S shape.

With reference to FIG. 19A, FIG. 19B, and FIG. 19C, continuously, the word line 207 includes a metal layer 214 and dielectric layers 215, the dielectric layers 215 include a first dielectric layer 216, a second dielectric layer 217, and a third dielectric layer 218, the metal layer 214 and the second dielectric layer 217 are disposed on a top surface of the first dielectric layer 216, the second dielectric layer 217 is disposed at two opposite side surfaces of the metal layer 214, and the third dielectric layer 218 is disposed on a top surface of the metal layer 214 and top surfaces of the second dielectric layer 217. The material of the first dielectric layer 216, the second dielectric layer 217, and the third dielectric layer 218 may be, for example, silicon dioxide, and the material of the metal layer 214 may be, for example, metal tungsten.

For the memory of this embodiment, the metal layer 214 and the second dielectric layer 217 is disposed on the top surface of the first dielectric layer 216, the second dielectric layer 217 is disposed at two opposite side surfaces of the metal layer 214, the third dielectric layer 218 is disposed on the top surface of the metal layer 214 and the top surface of the second dielectric layer 217, thereby separating the metal layer 214 from the active region 201 by the first dielectric layer 216, the second dielectric layer 217, and the third dielectric layer 218, so as to form the metal oxide semiconductor field effect transistor structure.

With reference to FIG. 19A, FIG. 19B, and FIG. 19C, continuously, a plurality of bit lines 101 are further disposed on the substrate 100, each bit line 101 extends along the row direction of the plurality of active regions 201, and the plurality of bit lines 101 are arranged along the column direction of the plurality of active regions 201.

For the memory of this embodiment, a plurality of bit lines 101 are formed on the substrate 100, each bit line 101 is enabled to extend along the row direction of the plurality of active regions 201 and the plurality of bit lines 101 are arranged along the column direction of the plurality of active regions 201. In this way, the electrical connection with the formed metal oxide semiconductor field effect transistor structure above is implemented.

With reference to FIG. 19A, FIG. 19B, and FIG. 19C, continuously, a plurality of bit line contact plungers 107 are distributed at intervals on the bit lines 101, the plurality of bit line contact plungers 107 are arranged along the row direction of the plurality of active regions 201, the plurality of bit line contact plungers 107 are all located in the isolation layer 200, the bottom of each bit line contact plunger 107 is electrically connected to a corresponding bit line 101, and the top of each bit line contact plunger 107 is electrically connected to a corresponding active region 201. The thickness of the bit line contact plunger 107 may be, for example, about 50 nm. In this way, the distance between the bit line 101 and the word line 207 is about 50 nm.

For the memory of this embodiment, a plurality of bit line contact plungers 107 are distributed at intervals on the bit lines 101, the plurality of bit line contact plungers 107 are enabled to be arranged along the row direction of the plurality of active regions 201, the plurality of bit line contact plungers 107 are all located in the isolation layer 200, the bottom of each bit line contact plunger 107 is electrically connected to a corresponding bit line 101, and the top of each bit line contact plunger 107 is electrically connected to a corresponding active region 201. In this way, a plurality of metal oxide semiconductor field effective transistor structures formed at the same row are enabled to be electrically connected through the same bit line 101, so as to simplify the structure of the memory.

With reference to FIG. 19A, FIG. 19B, and FIG. 19C continuously, a plurality of node contact plungers 219 are disposed at an end of each word line 207 departing from the substrate 100, each node contact plunger 219 is electrically connected to a corresponding active region 201, and the node contact plungers 219 correspond to the bit line contact plunger 107 one to one.

For the memory of this embodiment, a plurality of node contact plungers 219 are disposed at an end of each word line 207 departing from the substrate 100, each node contact plunger 219 is enabled to be electrically connected to the corresponding active region 201, and the node contact plungers 219 correspond to the bit line contact plunger 107 one to one, so that each word line 207 is electrically connected to the plurality of node contact plungers 219, so as to further enable each word line 207 to be electrically connected to a capacitor in electrical contact with each node contact plunger 219.

Each embodiment or implementation in this specification is described in a progressive manner, each embodiment mainly illustrates the difference from other embodiments, and same and similar parts among the embodiments can refer to one another.

In the descriptions of this specification, a description of a reference term such as "an embodiments", "some embodiments", "an exemplary embodiment", "an example", "a specific example", or "some examples" means that a specific feature, structure, material, or characteristic that is described with reference to the implementation or the example is included in at least one embodiments or example of the present disclosure. In this specification, exemplary descriptions of the foregoing terms do not necessarily refer to a same embodiments or example. Moreover, the described specific features, structures, materials, or characteristics may be combined in a proper manner in any one or more of the embodiments or examples.

It should be noted that: the embodiments above are merely used for explaining the technical solutions of the present disclosure rather than limiting same. Although the description already explains the present disclosure in detail with reference to the embodiments above, a person having ordinary skill in the art should understand that the technical solutions recited in the embodiments above can still be modified or some or all technical features therein are equivalently replaced. Moreover, the modifications or improvements do not enable the essence of the corresponding technical solutions to depart from the copes of the embodiments of the present disclosure.

What is claimed is:

1. A memory, comprising a substrate, wherein an isolation layer is disposed on the substrate, a plurality of active regions arranged in an array according to rows and columns are disposed in the isolation layer, and a plurality of word lines are formed in the plurality of active regions and the isolation layer; and wherein the plurality of word lines are arranged along a row direction of the plurality of active regions, each word line is in an S shape, the each word line comprises a plurality of gates disposed in the plurality of active regions and word line structures disposed in the isolation layer, the each word line is constituted by successive connection of the plurality of gates and the word line structures arranged at intervals, and the plurality of gates comprised in the each word line are disposed in two correspondingly adjacent columns of active regions, and any two adjacent gates in the each word line are disposed in two correspondingly adjacent rows of active regions.

2. The memory of claim 1, wherein the word line structures comprise first word line structures and second word line structures, wherein in the each word line, an end of any one first word line structure and an end of any one second word line structure that are adjacent are electrically connected through a corresponding gate; the first word line structures extend along a first direction, the first direction is disposed at an acute angle with respect to a row direction and a column direction of the plurality of active regions, the second word line structures extend along a second direction, and the second direction is disposed at an acute angle with respect to the row direction and the column direction of the plurality of active regions.

3. The memory of claim 2, wherein a plurality of bit lines are further disposed on the substrate, each bit line extends along the row direction of the plurality of active regions, and the plurality of bit lines are arranged along the column direction of the plurality of active regions.

4. The memory of claim 1, wherein the word line comprises a metal layer and dielectric layers, the dielectric layers comprise a first dielectric layer, a second dielectric layer, and a third dielectric layer, the metal layer and the second dielectric layer are disposed on a top surface of the first dielectric layer, the second dielectric layer is disposed at two opposite side surfaces of the metal layer, and the third dielectric layer is disposed on a top surface of the metal layer and top surfaces of the second dielectric layer.

5. The memory of claim 4, wherein a plurality of bit lines are further disposed on the substrate, the each bit line extends along a row direction of the plurality of active regions, and the plurality of bit lines are arranged along a column direction of the plurality of active regions.

6. The memory of claim 1, wherein a plurality of bit lines are further disposed on the substrate, each bit line extends along the row direction of the plurality of active regions, and the plurality of bit lines are arranged along the column direction of the plurality of active regions.

7. The memory of claim 6, wherein a plurality of bit line contact plungers are distributed at intervals on the plurality of bit lines, the plurality of bit line contact plungers are arranged along the row direction of the plurality of active regions, the plurality of bit line contact plungers are all located in the isolation layer, a bottom of the each bit line contact plunger is electrically connected to a corresponding bit line, and a top of the each bit line contact plunger is electrically connected to a corresponding active region.

8. The memory of claim 7, wherein a plurality of node contact plungers are disposed at an end of the each word line departing from the substrate, each node contact plunger is electrically connected to a corresponding active region, and the plurality of node contact plungers correspond to the plurality of bit line contact plungers one to one.

9. A method for manufacturing memory, comprising:
providing a substrate;
forming an isolation layer on the substrate;
forming, in the isolation layer, a plurality of active regions arranged in an array according to rows and columns; and
forming a plurality of word lines in the isolation layer and the plurality of active regions, wherein the plurality of word lines are arranged along a row direction of the plurality of active regions, each word line is an S shape, the each word line comprises a plurality of gates disposed in the plurality of active regions and word line structures disposed in the isolation layer, the each word line is constituted by successive connection of the plurality of gates and the word line structures arranged at intervals, and the plurality of gates comprised in the each word line are located in two correspondingly adjacent columns of active regions, and any two adjacent gates in the each word line are located in two correspondingly adjacent rows of active regions.

10. The method for manufacturing memory of claim 9, wherein said forming, in the isolation layer, the plurality of active regions arranged in the array according to rows and columns comprises:
forming, in the isolation layer, a plurality of concave holes with openings departing from the substrate;
filling each concave hole fully with second polycrystalline silicon;
etching the second polycrystalline silicon in the each concave hole; and
reserving a part of the second polycrystalline silicon at sidewalls of the each concave hole to form the plurality of active regions, wherein the plurality of active regions reserved in the plurality of concave holes are arranged in the array and are isolated from each other.

11. The method for manufacturing memory of claim 10, prior to said forming the isolation layer on the substrate, further comprising:
forming a plurality of bit lines on the substrate, wherein each bit line extends along the row direction of the plurality of active regions; and the plurality of bit lines are arranged along a column direction of the plurality of active regions.

12. The method for manufacturing memory of claim 11, prior to said forming the plurality of active regions arranged in the array according to rows and columns in the isolation layer, further comprising:
depositing first polycrystalline silicon at a bottom of the each concave hole to form a bit line contact plunger, wherein the bit line contact plunger is electrically connected to corresponding bit line.

13. The method for manufacturing memory of claim 11, after fully filling the concave hole with second polycrystalline silicon and before etching the second polycrystalline silicon in the each concave hole, further comprising:
forming a protective layer on the second polycrystalline silicon,
wherein etching the second polycrystalline silicon in the each concave hole comprises:
etching the protective layer and the second polycrystalline silicon to form a node contact slot and a word line slot, wherein the node contact slot is located over the word line slot and is communicated with the word line slot, a width of the node contact slot is greater than a width of the word line slot, the node contact slot is formed in the protective layer, the word line slot is formed in the isolation layer and in the active region;
forming a word line in the word line slot;
forming a node contact plunger in the node contact slot; and
enabling the formed node contact plunger to be electrically connected to corresponding active region.

14. The method for manufacturing memory of claim 11, wherein said forming the isolation layer on the substrate comprises:
forming an insulation layer at a bottom surface, a top surface, and two opposite side surfaces of the bit line; and
etching the insulation layer to form the isolation layer.

15. The method for manufacturing memory of claim 10, wherein said forming the plurality of word lines in the isolation layer and the active regions comprises:
forming, in the isolation layer and the active regions, a plurality of word line slots with slot openings departing from the substrate, wherein the each word line slot comprises the plurality of concave holes and a plurality of first word line slots and second word line slots that are arranged at intervals, and any two adjacent first word line slot and second word line slot have an included angle and are communicated through a corresponding concave hole; and
forming, in the each word line slot, a metal layer and dielectric layers packaging at a bottom surface, a top surface, and two opposite side surfaces of the metal layer to form the word line, wherein the word line comprises a plurality of first word line structures, a plurality of second word line structures and a plurality of gates, each first word line structure is formed in a corresponding first word line slot, each second word line structure is formed in a corresponding second word line slot, each gate is formed in a corresponding concave hole, and any two adjacent first word line structure and second word line structure are electrically connected through a corresponding gate.

16. The method for manufacturing memory of claim 15, prior to said forming the isolation layer on the substrate, further comprising:
forming a plurality of bit lines on the substrate, wherein each bit line extends along a row direction of the plurality of active regions, and the plurality of bit lines are arranged along a column direction of the plurality of active regions.

17. The method for manufacturing memory of claim 15, wherein said forming, in the each word line slot, the metal layer and the dielectric layers packaging at the bottom surface, the top surface, and the two opposite side surfaces of the metal layer to form the word line comprises:
forming a first dielectric layer at the bottom of the word line slot;
forming a second dielectric layer on the first dielectric layer in the word line slot, wherein the second dielectric layer is formed on a sidewall of the active region;
forming the metal layer on the first dielectric layer in the word line slot and a sidewall of the second dielectric layer away from the active region in the word line slot, wherein the word line slot is fully filled by the metal layer;

etching back to a top of the metal layer; and forming a third dielectric layer on the metal layer of the word line slot.

18. The method for manufacturing memory of claim 17, prior to said forming the isolation layer on the substrate, further comprising:

forming a plurality of bit lines on the substrate, wherein each bit line extends along a row direction of the plurality of active regions, and the plurality of bit lines are arranged along a column direction of the plurality of active regions.

* * * * *